US012125895B2

(12) United States Patent
Dorow et al.

(10) Patent No.: US 12,125,895 B2
(45) Date of Patent: Oct. 22, 2024

(54) TRANSITION METAL DICHALCOGENIDE (TMD) LAYER STACK FOR TRANSISTOR APPLICATIONS AND METHODS OF FABRICATION

(71) Applicant: Intel Corporation, Santa Clara, CA (US)

(72) Inventors: Chelsey Dorow, Portland, OR (US); Kevin O'Brien, Portland, OR (US); Carl Naylor, Portland, OR (US); Uygar Avci, Portland, OR (US); Sudarat Lee, Hillsboro, OR (US); Ashish Verma Penumatcha, Hillsboro, OR (US); Chia-Ching Lin, Portland, OR (US); Tanay Gosavi, Portland, OR (US); Shriram Shivaraman, Hillsboro, OR (US); Kirby Maxey, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 891 days.

(21) Appl. No.: 16/915,600

(22) Filed: Jun. 29, 2020

(65) Prior Publication Data
US 2021/0408375 A1    Dec. 30, 2021

(51) Int. Cl.
*H01L 29/66* (2006.01)
*B82Y 10/00* (2011.01)
(Continued)

(52) U.S. Cl.
CPC .. *H01L 29/66439* (2013.01); *H01L 21/02568* (2013.01); *H01L 29/66969* (2013.01);
(Continued)

(58) Field of Classification Search
CPC ......... H01L 29/66439; H01L 21/02568; H01L 29/66969; H01L 29/775; H01L 29/78696;
(Continued)

(56) References Cited

U.S. PATENT DOCUMENTS

| 10,388,732 B1 | 8/2019 | Frougier et al. |
| 2015/0122315 A1 | 5/2015 | Shin et al. |

(Continued)

OTHER PUBLICATIONS

Extended European Search Report from European Patent Application No. 20208898.5 notified May 11, 2021, 10 pgs.

(Continued)

*Primary Examiner* — Yara B Green
*Assistant Examiner* — Akhee Sarker-Nag
(74) *Attorney, Agent, or Firm* — Essential Patents Group, LLP

(57) ABSTRACT

A transistor includes a channel including a first layer including a first monocrystalline transition metal dichalcogenide (TMD) material, where the first layer is stoichiometric and includes a first transition metal. The channel further includes a second layer above the first layer, the second layer including a second monocrystalline TMD material, where the second monocrystalline TMD material includes a second transition metal and oxygen, and where the second layer is sub-stoichiometric. The transistor further includes a gate electrode above a first portion of the channel layer, a gate dielectric layer between the channel layer and the gate electrode, a source contact on a second portion of the channel layer and a drain contact on a third portion of the channel layer, where the gate electrode is between drain contact and the source contact.

20 Claims, 16 Drawing Sheets

(51) Int. Cl.

| | |
|---|---|
| *B82Y 25/00* | (2011.01) |
| *H01L 21/02* | (2006.01) |
| *H01L 29/06* | (2006.01) |
| *H01L 29/24* | (2006.01) |
| *H01L 29/423* | (2006.01) |
| *H01L 29/775* | (2006.01) |
| *H01L 29/786* | (2006.01) |
| *H10B 63/00* | (2023.01) |
| *H10N 70/20* | (2023.01) |

(52) U.S. Cl.
 CPC ...... *H01L 29/775* (2013.01); *H01L 29/78696* (2013.01); *H10B 63/30* (2023.02); *H10B 63/34* (2023.02); *H10N 70/253* (2023.02)

(58) Field of Classification Search
 CPC ................ H01L 29/0673; H01L 29/24; H01L 29/42364; H10B 63/30; H10B 63/34; H10N 70/253; B82Y 10/00; B82Y 25/00

See application file for complete search history.

(56) References Cited

U.S. PATENT DOCUMENTS

| | | | |
|---|---|---|---|
| 2016/0141427 A1* | 5/2016 | Chen ................ | H01L 29/78681 |
| | | | 257/349 |
| 2017/0015599 A1* | 1/2017 | Bessonov ............. | C04B 35/581 |
| 2018/0145184 A1 | 5/2018 | Clifton et al. | |
| 2021/0193801 A1* | 6/2021 | Wang ..................... | H01L 29/41 |

OTHER PUBLICATIONS

Akinwande, Deji et al., "Graphene and two-dimensional materials for silicon technology", Nature, vol. 573, Sep. 26, 2019, 12 pgs.

Hou, Nannan et al., "Fabrication of oxygen-doped MoSe2 hierarchical nanosheets for highly sensitive and selective detection of trace trimethylamine at room temperature in air", Nano Research, 13(6), 2020, 9 pgs.

Ryder, Christopher R. et al., "Chemically Tailoring Semiconducting Two-Dimensional Transition Metal Dichalcogenides and Black Phosphorous", ACS Nano, 10, 2016, 18 pgs.

Walter, Timothy N. et al., "Oxidation and oxidative vapor-phase etching of few-layer MoS2", J. Vac. Sci. Technol. B 35(2), Mar./Apr. 2017, 10 pgs.

* cited by examiner

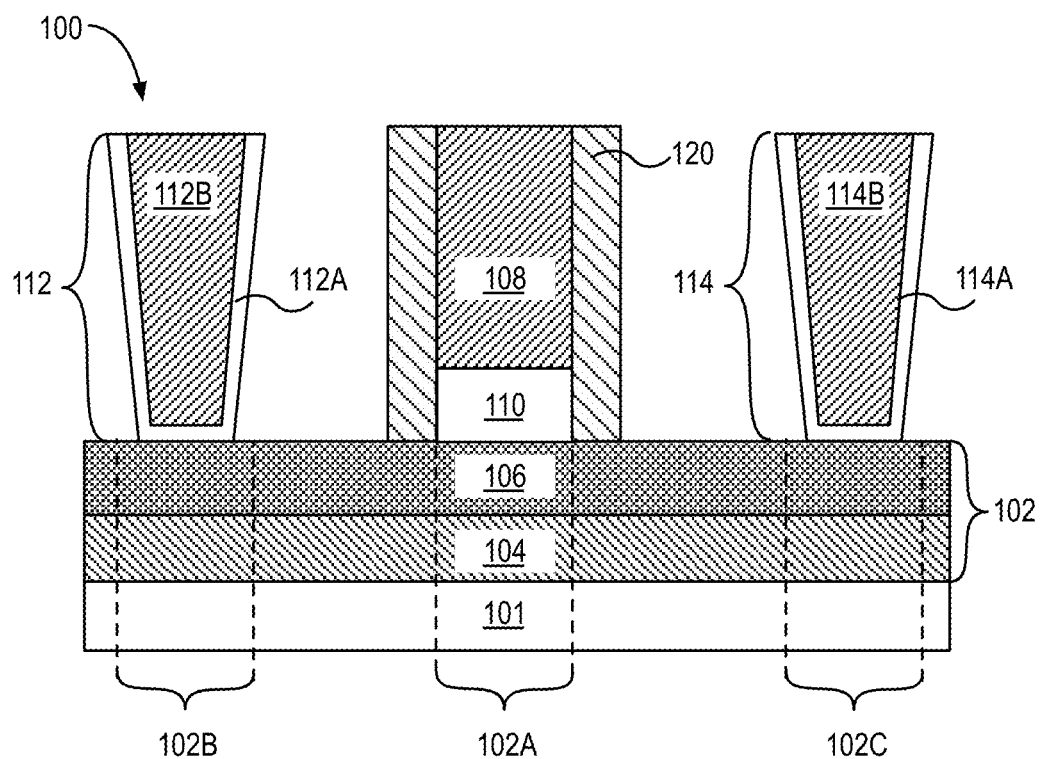
FIG. 1A
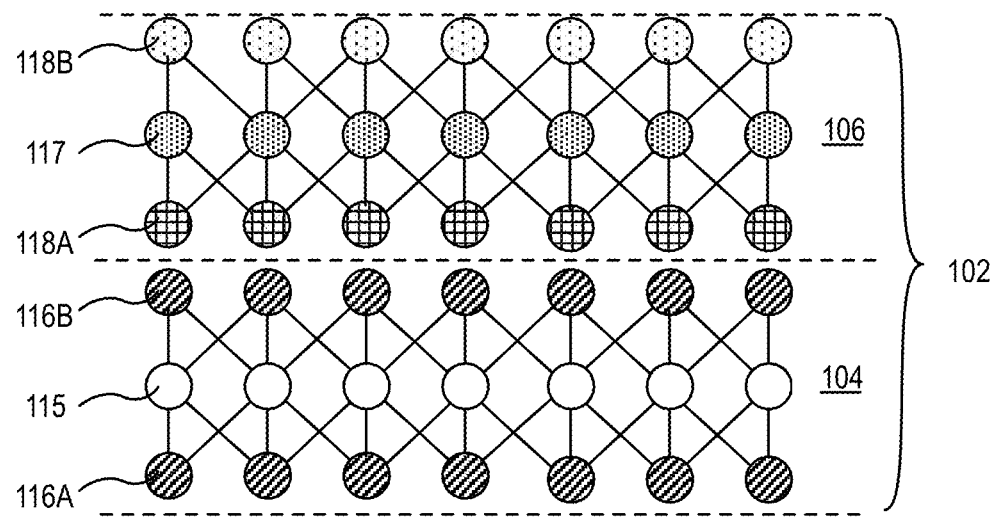
FIG. 1B
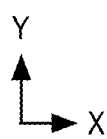

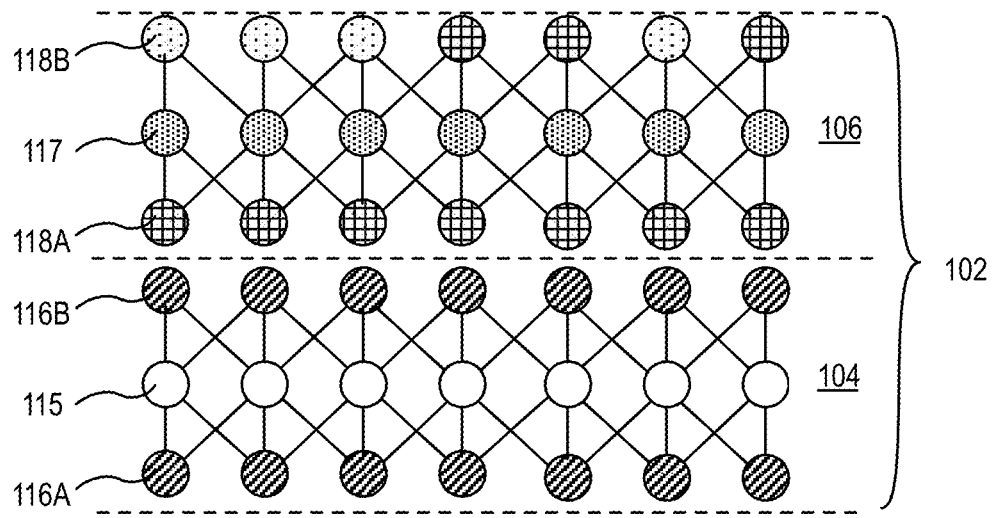
FIG. 1C
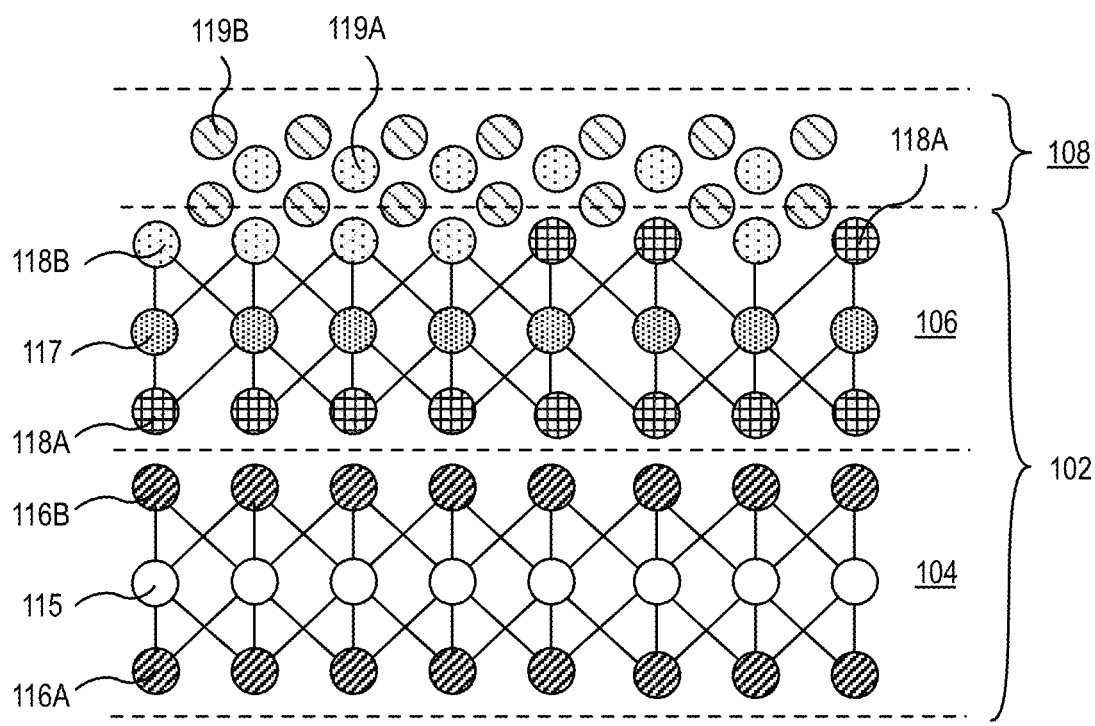
FIG. 1D

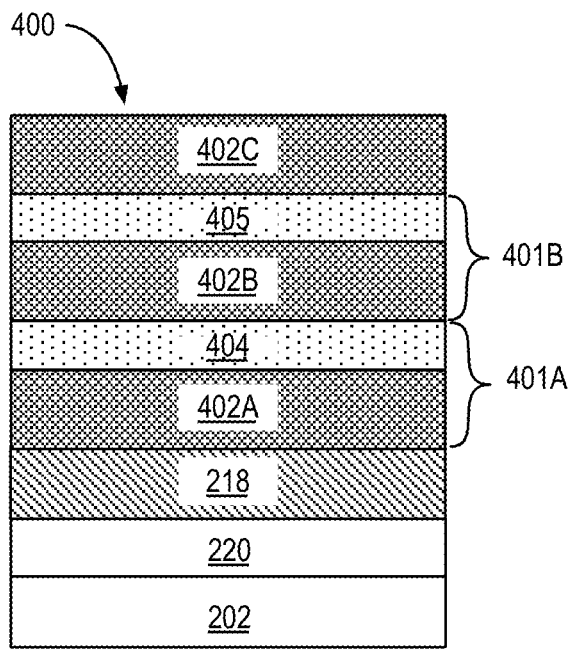
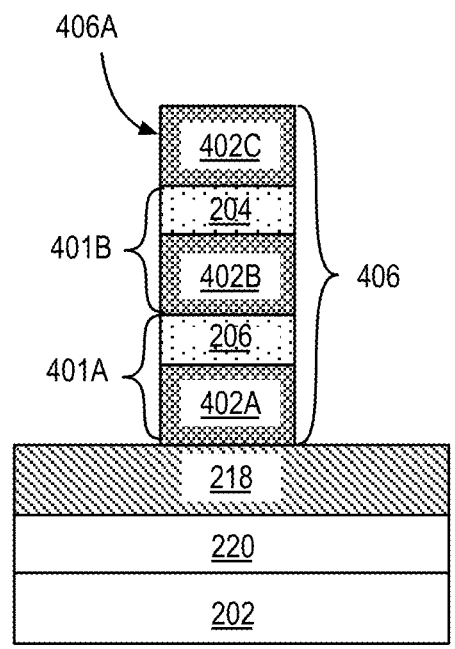
FIG. 4A          FIG. 5A
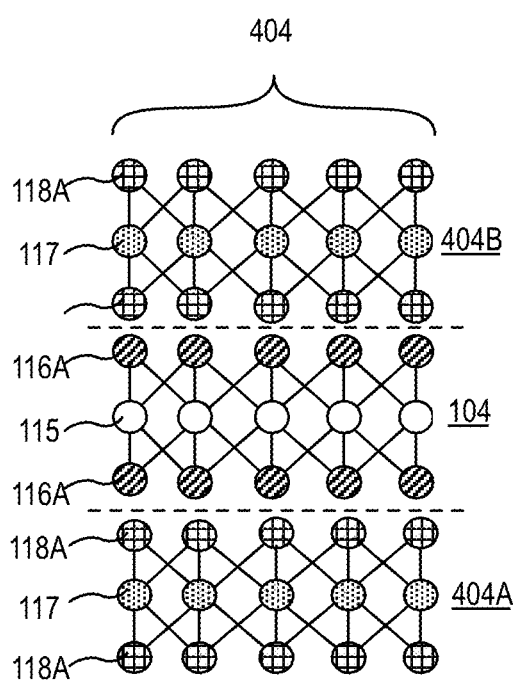
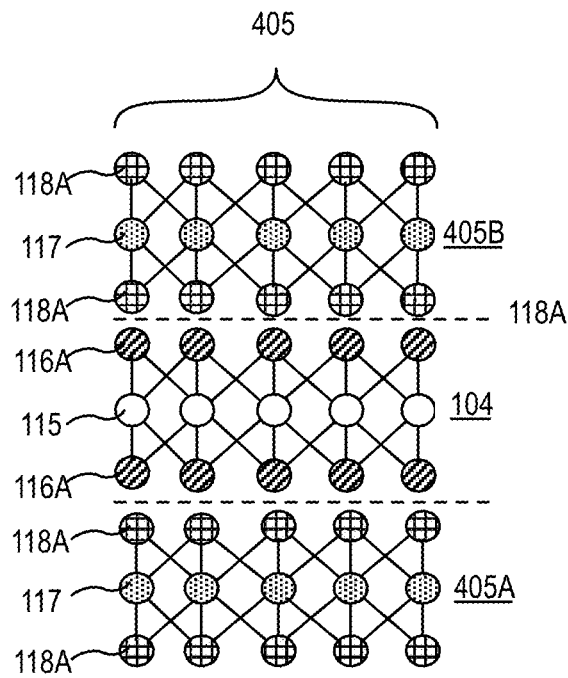
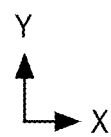
FIG. 4B          FIG. 4C

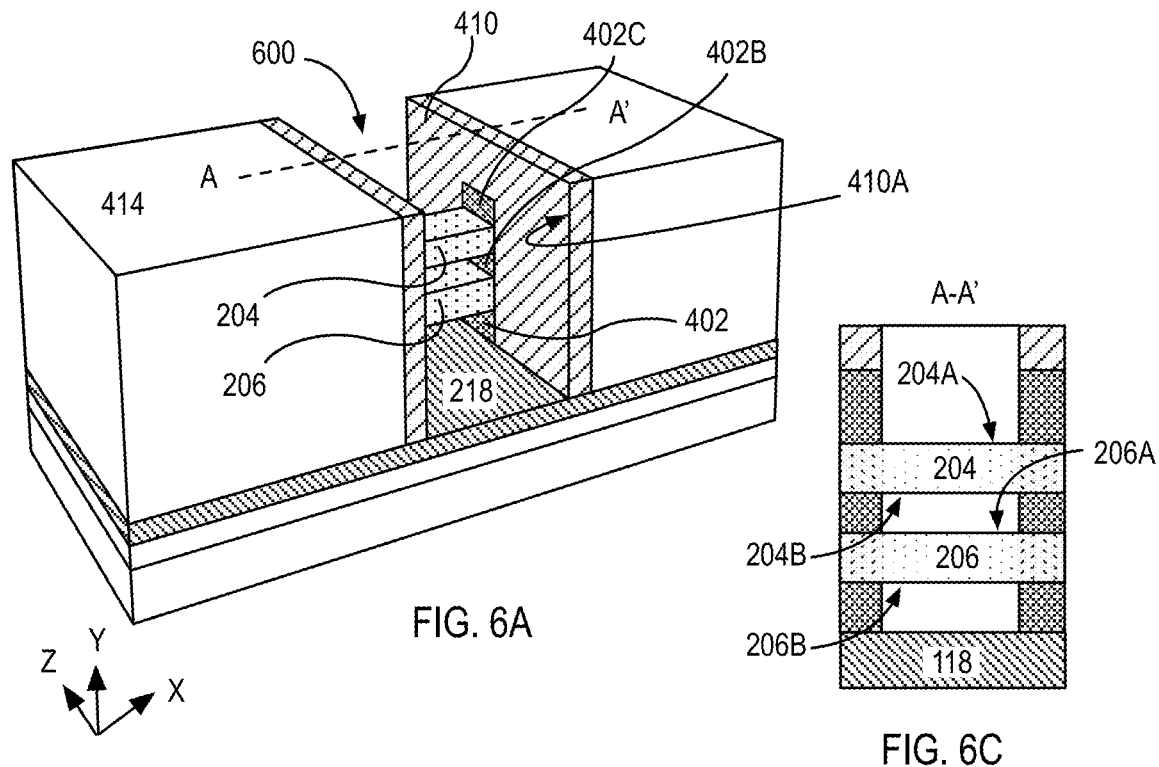
FIG. 6A
FIG. 6C
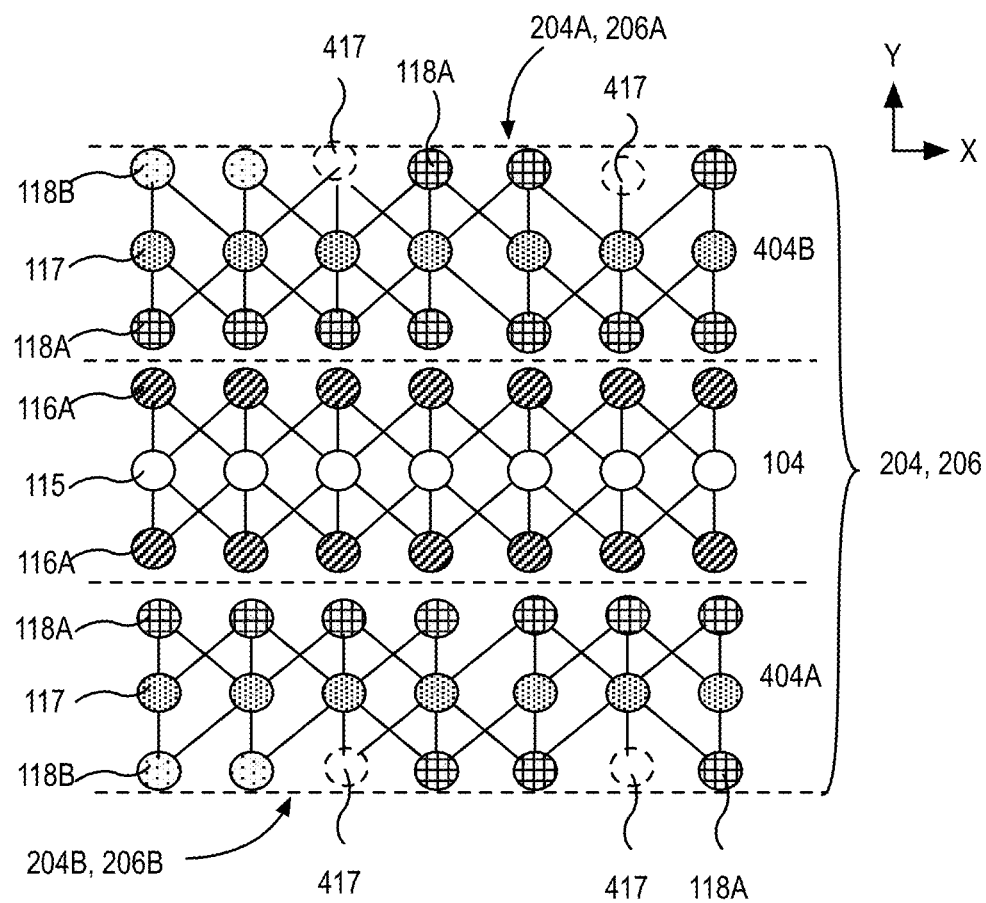
FIG. 6B

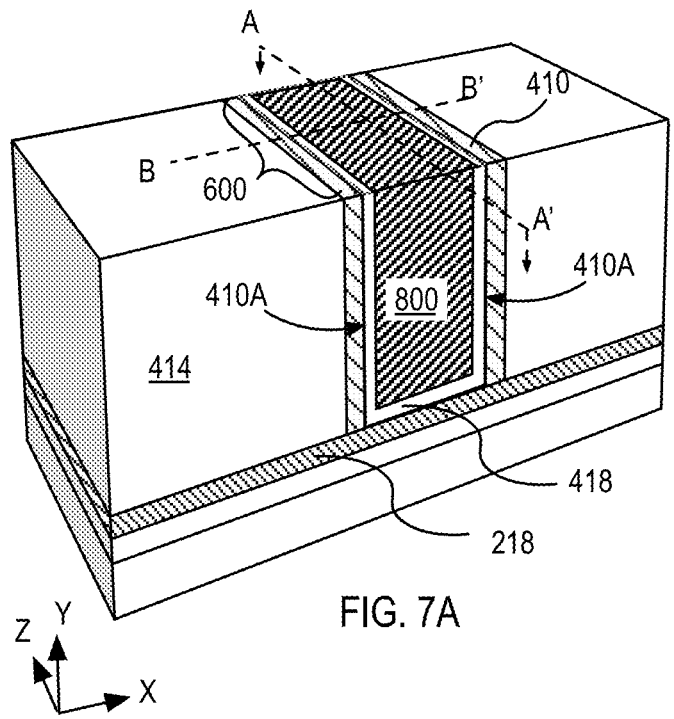
FIG. 7A
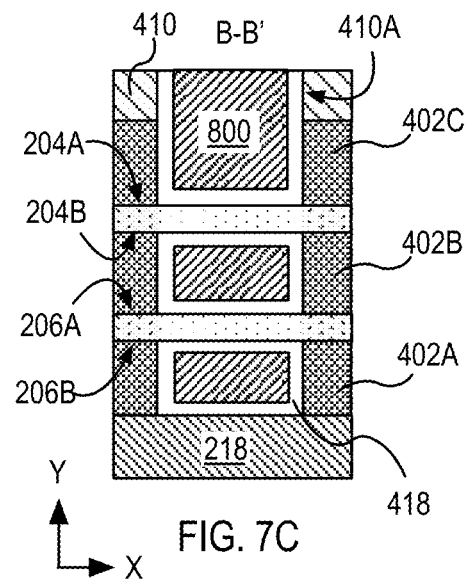
FIG. 7C
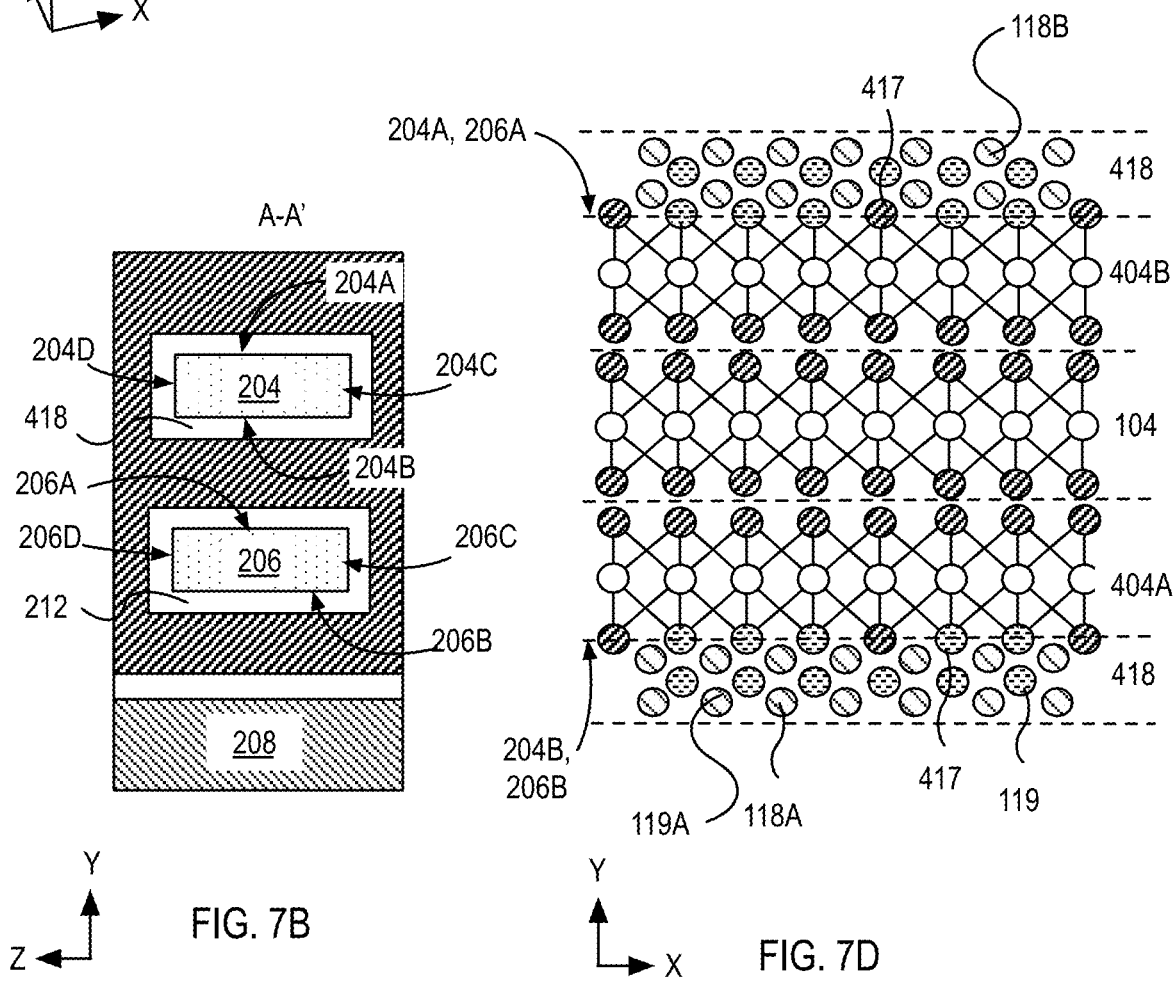
FIG. 7B
FIG. 7D

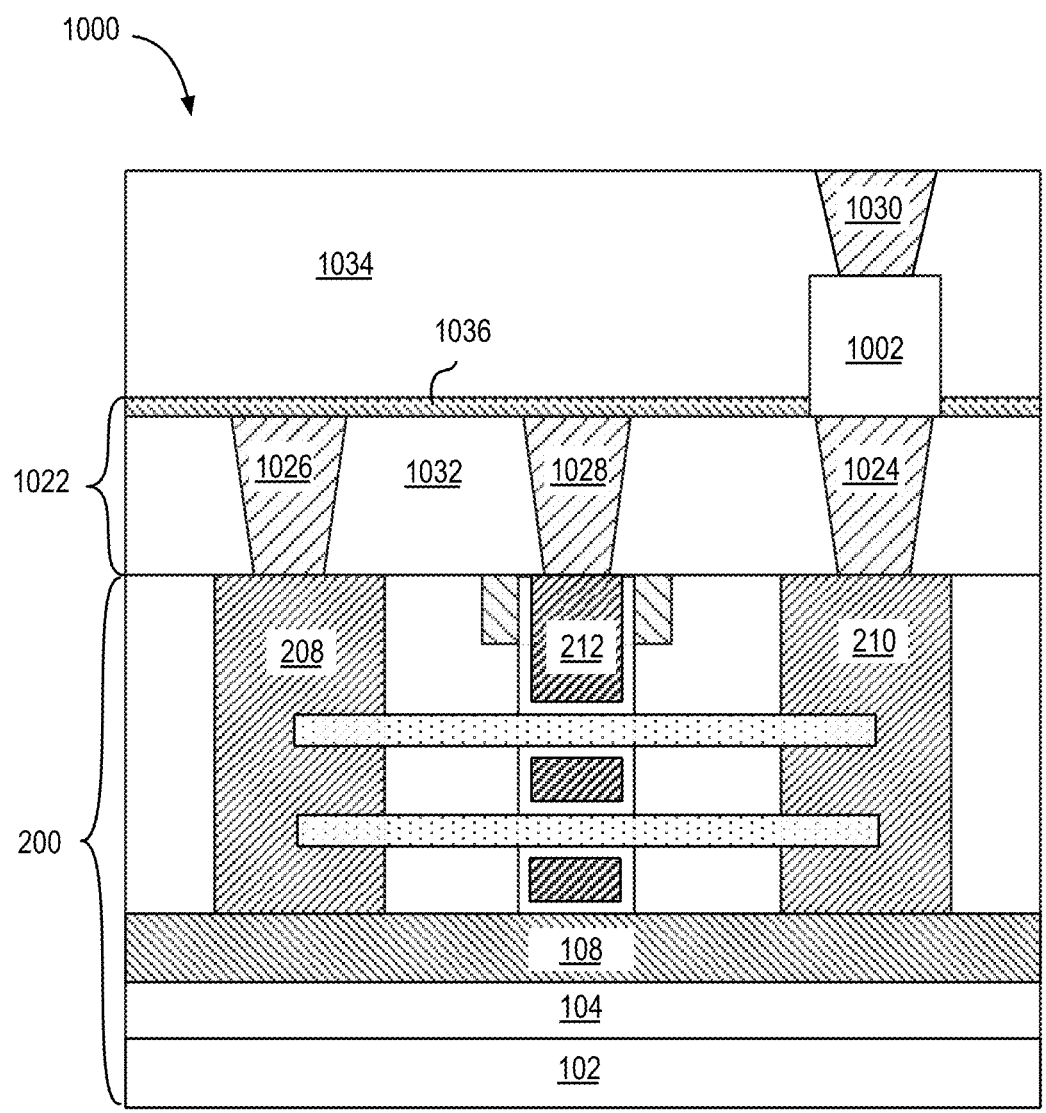
FIG. 10A
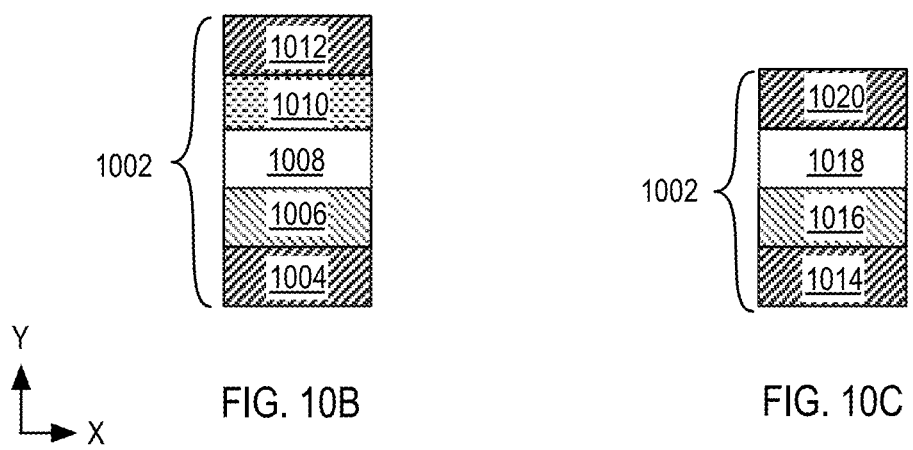
FIG. 10B
FIG. 10C

TRANSITION METAL DICHALCOGENIDE (TMD) LAYER STACK FOR TRANSISTOR APPLICATIONS AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of devices on a chip, lending to the fabrication of products with increased functionality. Scaling of such transistors which include silicon channels becomes more challenging when device metrics such as mobility, subthreshold slope or gate capacitance for example, become adversely affected at dimensions less than 5 nm. While transistors have relied on silicon channels, it has become increasingly significant to develop non-silicon-based channel material. Some examples of non-silicon-based channel materials include transition metal dichalcogenide (TMD). One or more monolayers of TMD materials may be implemented as channel layers in nanowire architecture to improve mobility and subthreshold slope as well as enable transistor scaling. However, integrating TMD materials with gate dielectric materials are challenging because they lack dangling bonds that facilitate nucleation of gate dielectric material. As such creation of a stack of TMD layers where outer most layers of the stack can facilitate nucleation is highly desirable.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A is a cross-sectional illustration of a transistor including a plurality of 2-dimensional TMD layers in accordance with an embodiment of the present disclosure.

FIG. 1B is a schematic of a material layer stack including a first monocrystalline layer including a TMD material and a second layer including a second monocrystalline TMD material on the first monocrystalline layer.

FIG. 1C is a schematic of a material layer stack including a first monocrystalline layer including a TMD material and a second layer including a second monocrystalline TMD material on the first monocrystalline layer.

FIG. 1D is a schematic of a material layer stack including a first monocrystalline layer including a TMD material and a second layer including a second monocrystalline TMD material on the first monocrystalline layer and a couple of monolayers of a gate dielectric layer on the second monocrystalline TMD material.

FIG. 4A is an cross-sectional illustration of material layer stack for fabrication of a TMD transistor device, where the material layer stack includes a plurality of bilayers of a TMD layer on a sacrificial layer, in accordance with an embodiment of the present disclosure.

FIG. 4B is a schematic of a first stack of TMD monolayers.

FIG. 4C is a schematic of a second stack of TMD monolayers.

FIG. 5A is a cross sectional illustration of a block formed by patterning the material layer stack

FIG. 6A illustrates the structure of FIG. 5A following the process to remove the dummy gate structure and portions of the sacrificial layer that are exposed after removing the dummy gate structure, where the process creates a first and a second TMD channel in an opening.

FIG. 6B is a schematic of a first or a second TMD channel following the process to treat TMD monolayers in the first or the second TMD channel.

FIG. 6C is a cross-sectional illustration of the structure in FIG. 6A through a line A-A'.

FIG. 7A illustrates the structure of FIG. 6A following the formation of a gate dielectric layer in the opening and formation of a gate electrode on the gate dielectric layer.

FIG. 7B is a cross-sectional illustration of a block sliced through a line A-A' of the structure in FIG. 7A.

FIG. 7C is a cross-sectional illustration of the structure in FIG. 7A along the line B-B'.

FIG. 7D is a schematic of stacked TMD monolayers in a first or a second TMD channel, following the process to form a gate dielectric layer.

FIG. 10A is a cross-sectional illustration of a memory device coupled with a transistor including a plurality of TMD channels, in accordance with an embodiment of the present disclosure.

FIG. 10B is a cross-sectional illustration of a magnetic tunnel junction device, in accordance with an embodiment of the present disclosure.

FIG. 10C is a cross-sectional illustration of a resistive random-access memory device, in accordance with an embodiment of the present disclosure.

DESCRIPTION OF THE EMBODIMENTS

Figure 1E:
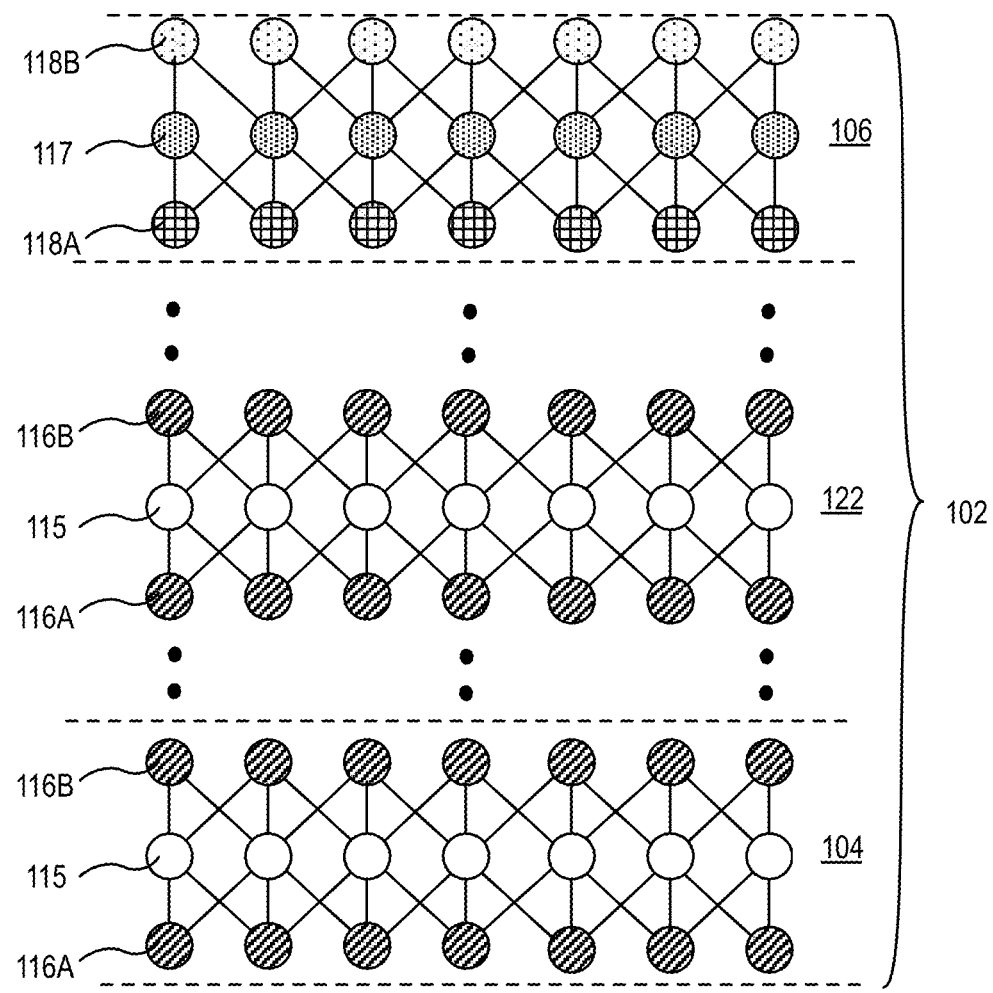
FIG. 1E is a schematic of a material layer stack including a first monocrystalline layer including a TMD material, a second layer including a second monocrystalline TMD material on the first monocrystalline layer, and a plurality of first monocrystalline layer, therebetween.

TMD layer stack for transistor applications and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with group III-N transistor, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable feature scaling below 10 nm silicon channels, MOSFET devices may utilize a variety materials and adopt various transistor architectures. Examples of materials include introduction of channel materials such as for example, Ge channel, III-V materials and two dimensional TMD materials, provide high channel mobility and increase operational frequency. Further material examples include implementation of high-K gate dielectric layer to enable transistors to operate with lower current leakage and improve device reliability. Examples of architectural changes include non-planar transistors to increase gate control and operate at lower voltage and lower current leakage, and nanowire designs to further enable gate all around control and further reduce leakage current.

While high electron mobility of TMD materials are advantageous for planar transistor, nanowires fashioned from two dimensional materials, such as transition metal dichalcogenide (TMD), offer several advantages over conventional silicon. A nanowire may include anywhere between 1-10 monolayers of a TMD material, where each monolayer may be on the order of 0.7 nm. Because TMD materials have a high Young's modulus and can be utilized to form essentially 2-dimensional or ultrathin nanowires, such as nanowires that are less than 5 nm thick. However, while pristine, self-passivated 2D-TMD materials facilitate atomically thin transistor channels, such 2D-TMD materials lack dangling bonds needed for ALD nucleation for gate dielectric layer growth.

The inventors have found that when two or more monolayers of TMD materials are stacked, an uppermost monolayer for may be altered for improved gate dielectric layer growth. For example, the uppermost monolayer may be altered by breaking the metal-chalcogen bonds to provide nucleation sites for oxygen atoms in a material of a gate dielectric layer to bond with the metal. Such a TMD channel may facilitate planar and non-planar transistors.

In nanowire geometry, where the stack includes at least three or more monolayers of TMD, an uppermost and a lowermost monolayer may be chemically altered. When an uppermost and a lowermost monolayer is altered to provide nucleation sites, a gate dielectric layer may be formed on both the uppermost and a lowermost monolayers of the TMD stack. The process to alter the uppermost and the lowermost monolayers TMD stack, may not appreciably degrade the one or more monolayers of TMD sandwiched therebetween. Thus, a nanowire fashioned from at least three layers may provide an essentially 2D-channel for improved mobility, while having a three-dimensional structure.

In accordance with an embodiment of the present disclosure a transistor includes a channel having a stack of TMD layers. The transistor may have a planar or non-planar geometry. in an embodiment, the stack includes a first layer comprising a first monocrystalline transition metal dichalcogenide (TMD) material, where the first layer is stoichiometric and comprises a first transition metal. The stack further includes a second layer above the first layer, the second layer comprises a second monocrystalline TMD material, where the second monocrystalline TMD material comprises a second transition metal and oxygen. The second layer is sub-stoichiometric. A gate electrode is above a first portion of the channel layer and a gate dielectric layer is between the channel layer and the gate electrode. The transistor further includes a source contact on a second portion of the channel layer in contact with the TMD channel and a drain contact on a third portion of the channel, where the gate electrode is between drain contact and the source contact. In embodiments, the channel may include further layers of monocrystalline TMD material between the first layer and the second layer.

FIG. 1A is a cross-sectional illustration of a transistor 100 above a substrate 101, where the transistor includes a channel 102 having a stack of TMD layers (herein TMD stack 102). The transistor may have a planar or non-planar geometry. In the illustrative embodiment, the transistor 100 has a planar geometry. In an embodiment, the TMD stack 102 includes a layer 104 comprising a first monocrystalline transition metal dichalcogenide (TMD) material (herein TMD monolayer 104), where the TMD monolayer 104 is stoichiometric and comprises a first transition metal. The stack further includes a layer 106 above the TMD monolayer 104, the layer 106 comprises a second monocrystalline TMD material (herein TMD monolayer 106). The TMD monolayer 106 comprises a transition metal and oxygen. The TMD monolayer 106 is sub-stoichiometric. A gate electrode 108 is above a portion 102A of the TMD stack 102 and a gate dielectric layer 110 is between the TMD stack 102 and the gate electrode 108. The transistor 100 further includes a source contact 112 on a portion 102B of the TMD stack 102, where the source contact 112 is in contact with the TMD channel 106. A drain contact 114 is on a portion 102C of the TMD stack 102, as shown.

FIG. 1B is a schematic of a portion, for example 102A, of TMD stack 102 illustrated in FIG. 1A. As shown a monolayer of TMD monolayer 104 is on the monolayer of TMD monolayer 106. In the illustrative embodiment, TMD monolayer 104 includes a layer of transition metal 115 between a layer of a chalcogen atoms 116A and a layer of chalcogen atoms 116B, as shown. Depending on arrangements of the atoms, TMD monolayer 104 can have various crystal orientations, such as trigonal prismatic (hexagonal), octahedral (tetragonal, T) or their distorted phase (TO). In the illustrative embodiment, the TMD monolayer 104 is hexagonal. The monolayer of TMD monolayer 104, as shown has a thickness of approximately 0.7 nm. The transition metal 115 includes molybdenum, tungsten or chromium, and the chalcogen atoms 116A and 116B includes at least one of sulfur, selenium or tellurium. TMD monolayer 104 described above advantageously provide channel mobility as high as 700 cm² V⁻¹ s⁻¹.

In the exemplary embodiment, TMD monolayer 106 includes a layer of a transition metal 117 between a layer of a chalcogen atoms 118A and a layer of oxygen atoms 118B, as shown. Depending on arrangements of the atoms, TMD monolayer 106 can have various crystal orientations, such as trigonal prismatic (hexagonal), octahedral (tetragonal, T) or their distorted phase (TO). In the illustrative embodiment, the TMD monolayer 106 is hexagonal. The monolayer of TMD monolayer 106, as shown has a thickness of approximately 0.7 nm. The transition metal 117 includes molybdenum, tungsten or chromium. It is to be appreciated that transition metal 115 and transition metal 117 may or may not include a same metal.

In an exemplary embodiment, transition metal 115 and transition metal 117 include a same metal. The following embodiments enumerated below (embodiments one through five) assume that transition metal 115 and transition metal 117 include a same metal.

In a first embodiment, the chalcogen atoms 118A in TMD monolayer 106 include oxygen. In a second embodiment, the chalcogen atoms 118A include an atom different from oxygen, such as sulfur, selenium or tellurium. In a third embodiment, chalcogen atoms 118A, 116A and 116B each include one of sulfur, selenium or tellurium. In such embodiments, only the uppermost plane including atoms 118B of TMD monolayer 106 are oxygen.

In a fifth embodiment, chalcogen atoms 118A, 116A and 116B each include one of sulfur, selenium or tellurium and the uppermost plane of TMD monolayer 106 further includes one or more chalcogen atoms 118A adjacent to oxygen atoms 118B as shown in FIG. 1C. In some such embodiments, TMD monolayer 106 has a composition $MX_nO_{1-n}$, wherein M is the transition metal 117, X is a chalcogen atom 118A, O is oxygen atom 118B, and where $0<n<1$. In the fifth embodiment, all chalcogen atoms 118A, 116A and 116B are the same.

Enumerated embodiments one through five are also applicable when transition metal 115 and transition metal 117 do not include a same metal. In other embodiments, transition metal 115 and transition metal 117 do not include a same metal but include the one or more features of the embodiments one through five above.

In exemplary embodiments, the TMD stack 102 has thickness less than 1.5 nm.

FIG. 1D is a schematic of a portion, for example 102A, of TMD stack 102 and a portion of the gate dielectric layer 110 above portion 102A, illustrated in FIG. 1A. As shown, the gate dielectric layer 110 includes oxygen 119A and a metal 119B such as hafnium, silicon, titanium, tantalum, lanthanum, aluminum, zirconium, barium, strontium, yttrium, lead, scandium, niobium, tungsten, molybdenum or zinc.

Presence of oxygen 118B in the TMD monolayer 106 may facilitate defect free adhesion between the gate dielectric layer 110 and TMD monolayer 106. Defect free adhesion can be advantageous gate dielectric layer 110 to be lattice matched with the TMD monolayer 106. A lattice matched gate dielectric layer 110 and TMD monolayer 106 can substantially eliminate gate current leakage.

In other embodiment, TMD stack 102 further comprises a plurality of TMD monolayers between the TMD monolayer 104 and TMD monolayer 106 as illustrated in FIG. 1E. In the illustrative embodiment, a third TMD monolayer 122 is between TMD monolayer 104 and TMD monolayer 106. In an exemplary embodiment, TMD monolayer 122 includes a material that is the same or substantially the same as materials of the TMD monolayer 104, wherein each of the plurality of layers is stoichiometric. For example, TMD monolayer 122 includes the transition metal 115 between the layer of chalcogen atoms 116A, and the layer of chalcogen atoms 116B. Depending on embodiments, the number of layers in the plurality of layers is between 3 and 10, and wherein each TMD monolayer 122 has a thickness of at most 0.7 nm.

Referring again to FIG. 1A, the transistor 100 further includes a dielectric spacer 120 adjacent to the electrode 108 and gate dielectric layer 110. The dielectric spacer 120 may include a material such as silicon nitride, silicon oxide, silicon carbide, silicon nitride doped with carbon, and silicon oxynitride.

In an embodiment, gate electrode 108 includes a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, or hafnium carbide, zirconium carbide, titanium carbide, tantalum carbide, and aluminum carbide.

In an embodiment, the gate dielectric layer 110 includes hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In embodiments the gate dielectric layer 110 has a thickness between 0.8 nm and 2 nm.

In the illustrative embodiment, the source contact 112 includes a barrier layer 112A and a fill metal 112B. In some examples, the barrier layer 112A includes a material such as tantalum nitride or ruthenium. In some examples, the fill metal 112B includes a material such as cobalt, copper or tungsten. In the illustrative embodiment, the drain contact 114 includes a barrier layer 114A and a fill metal 114B. In some examples, the barrier layer 114A includes a material such as tantalum nitride or ruthenium. In some examples, the fill metal 114B includes a material such as cobalt, copper or tungsten.

In an embodiment, the substrate 101 includes a suitable semiconductor material such as but not limited to, single crystal silicon, polycrystalline silicon and silicon on insulator (SOI) material, where a trilayer stack includes a layer of silicon oxide between two layers of monocrystalline silicon. In another embodiment, substrate 101 includes other semiconductor materials such as germanium, silicon germanium or a suitable group III-N or a group III-V compound. Logic devices such as MOSFET transistors and access transistors and may also be formed on or above substrate 101.

Figure 2A:
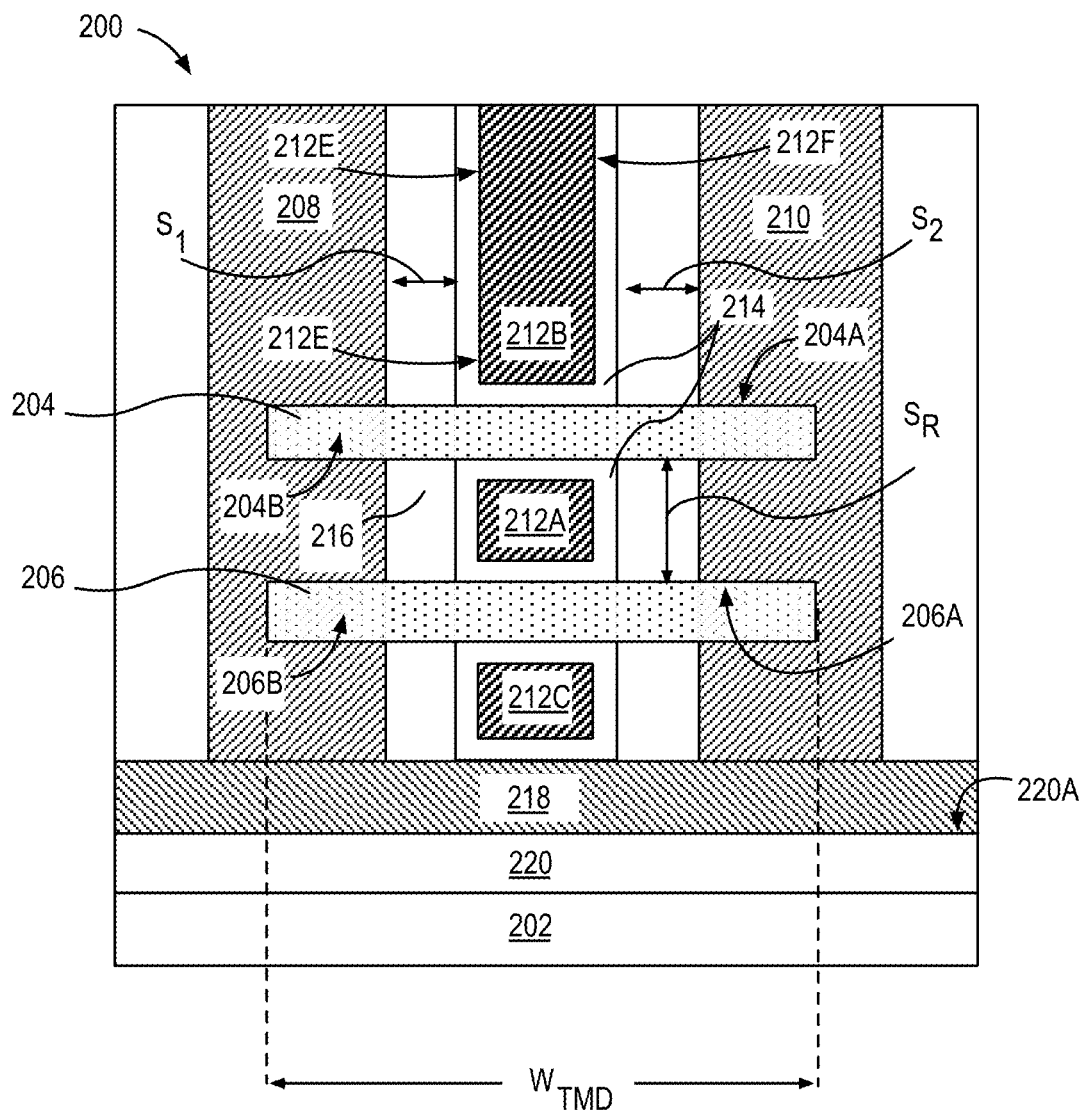
FIG. 2A is a cross-sectional illustration of a transistor including a plurality of stacked TMD monolayers, in accordance with an embodiment of the present disclosure.

FIG. 2A is a cross-sectional illustration of a transistor 200 above a substrate 202. The transistor 200 includes a channel 204 over a channel 206, where each channel 204 and channel 206 includes a stack of 3 or more layers of monocrystalline transition metal dichalcogenide (TMD) materials, (herein TMD channel 204 and TMD channel 206). The transistor 200 further includes a source contact 208 coupled to an end of the TMD channel 204 and TMD channel 206 and a drain contact 210 coupled to a second end of the TMD channel 204 and TMD channel 206, as shown. A gate electrode 212 is between the source contact 208 and the drain contact 210. The gate electrode 212 is between the TMD channel 204 and TMD channel 206 and a gate dielectric layer 214 is between the gate electrode 212 and the TMD channel 204 and TMD channel 206.

Figure 2B:
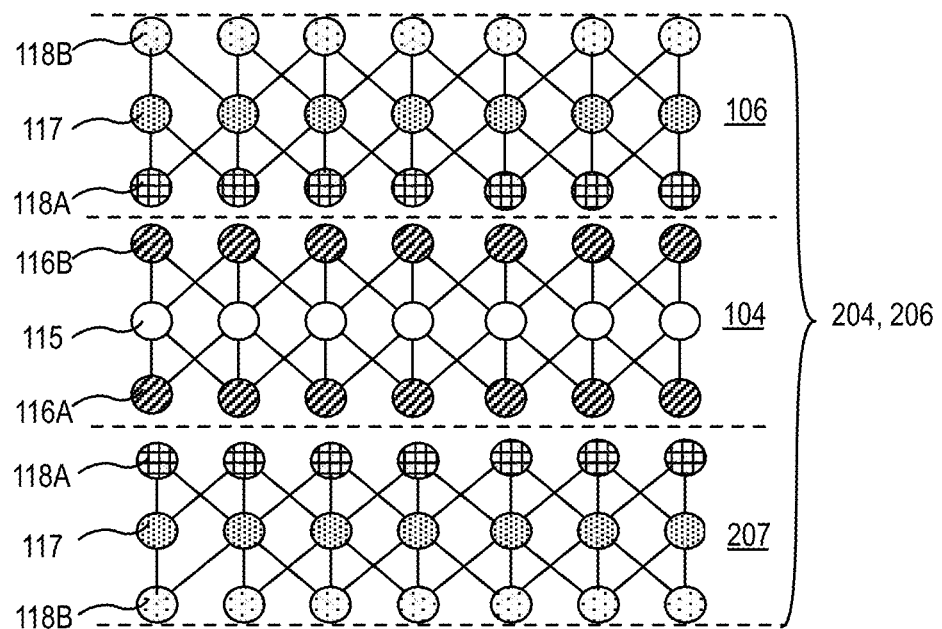
FIG. 2B is a schematic of a first or a second stack of TMD monolayers.

FIG. 2B is a schematic of TMD channel 204 or TMD channel 206. In the illustrative embodiment, TMD channel 204 or TMD channel 206 includes the TMD monolayer 104 and the layer 106 above the TMD monolayer 104, as described above in association with FIG. 1B. The TMD channel 204 or TMD channel 206 further includes a layer 207 below the TMD monolayer 104, where the layer 207 (herein TMD monolayer 207) includes the material of the monocrystalline TMD material of the layer 106. In the illustrative embodiment, TMD monolayer 207 includes the layer of transition metal 117 between the layer of chalcogen atoms 118A and a layer of oxygen atoms 118B, as shown.

As illustrated, TMD monolayer 106 has a first crystal orientation and the TMD monolayer 207 has a second crystal orientation, where the first crystal orientation is opposite to the second crystal orientation. In the illustrative embodiment, layer of transition metal 117 is above the layer of oxygen atoms 118B, and below the layer of chalcogen atoms 118A, which is opposite to the arrangement of layers in the TMD channel 106.

Examples and permutations of transition metals 115, 117, and chalcogens 118A, 118B, 116A and 116B in FIG. 2B are substantially similar to examples and permutations of transition metals 115, and chalcogens 118A, 118B, 116A and 116B described above in association with FIG. 1B.

Figure 2C:
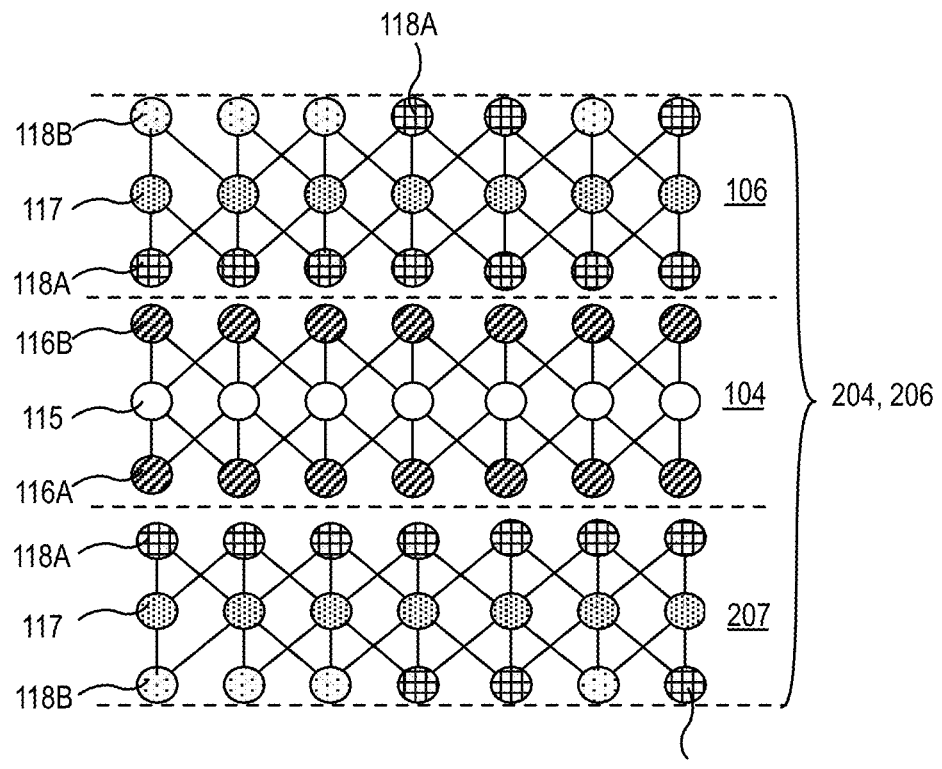
FIG. 2C is a schematic of the first or the second stack of TMD monolayers.

In other examples, the TMD monolayers 106 and 207 further include a chalcogen atom different from oxygen adjacent to the oxygen atom 118B, such as chalcogen atom 118A as shown in FIG. 2C. TMD monolayers 106 and 207 each have a composition $MX_nO_{1-n}$, wherein M is the transition metal 117, X is a chalcogen atom 118A and, O is oxygen atom 118B and wherein $0<n<1$.

In other embodiments, TMD channel 204 and TMD channel 206 each include a plurality of monolayers of a TMD material between the TMD monolayer 104 and the TMD monolayer 106 and/or between TMD monolayer 104 and the TMD monolayer 207. In exemplary embodiments, the plurality of monolayers each include a layer that is the same or substantially the same as the TMD monolayer 104. In some embodiments, the number of monolayers in the plurality of monolayers is between 1 and 5.

While a physical thickness of the sum of all TMD monolayers 104, 106 and 207 is at 2.1 nm, the actual thickness of TMD channel 204 and 206 may be different. be defined by the TMD monolayer 104 As such the TMD channel 204 or 206 may have a thickness that is at least 0.7 nm.

A TMD channel 204 or 206 having 4 monolayers of TMD material, for example, (3 nm or less) provides sufficient mobility advantage over silicon channel layers having a same thickness.

Referring to FIG. 2A, the transistor 200 further includes a source contact 208 coupled to a first end of the TMD channel 204 and TMD channel 206 and a drain contact 210 coupled to a second end of the TMD channel 204 and TMD channel 206, as shown. A gate electrode 212 is between the source contact 208 and the drain contact 210. The gate electrode 212 is between the TMD channel 204 and TMD channel 206 and a gate dielectric layer 214 is between the gate electrode 212 and the TMD channel 204 and TMD channel 206.

A TMD material can have atomically thin dimensions and yet provide a robust mechanical structure because of a high Young's modulus, such as above 200 GPa. TMD materials described above have a Youngs modulus that is as high as 270 GPa. A high Young's modulus provides sufficient strength to form suspended TMD channels 204 and 206, during a fabrication process. In an embodiment, TMD channel 204 and TMD channel 206 each have a lateral width, WTMD, that is between 50 nm and 100 nm.

The TMD channel 204 and TMD channel 206 have a vertical separation, $S_V$, as shown. In embodiments, $S_V$ is dependent on a thickness of a sacrificial material that is used to create the isolated TMD channels 204 and 206. $S_V$ may be between 4 nm and 10 nm. $S_V$ may depend on a horizontal thickness (into the plane of the Figure) of the TMD channels 204 and 206. A minimum $S_V$ may also be dependent on a minimum grain size of the material of the gate electrode 212 and on a minimum thickness of the gate dielectric layer 214.

As shown, the gate dielectric layer 214 is on an uppermost TMD channel surface 204A and below and directly in contact with a lowermost TMD channel surface 204B. As shown, a gate electrode portion 212A extends between the TMD channel surface 204B and TMD channel surface 206A. The gate dielectric layer 214 is also on the uppermost TMD channel surface 204A and below and directly in contact with lowermost TMD channel surface 206B, as shown. A gate electrode portion 212B is above TMD channel surface 204A and a gate electrode portion 212C is below TMD channel surface 206B. The gate electrode portions 212A, 212B and 212C are in contact with each other on a plane behind, and on a plane in front of the plane of the cross-sectional illustration shown in FIG. 2A.

In an embodiment, the gate dielectric layer 214 includes a material that is sufficiently crystalline to provide a uniform gate oxide in direct contact with surfaces of TMD channels 204 and 206. In an embodiment, the gate dielectric layer 214 includes a material that is the same or substantially the same as the material of the gate dielectric layer 110. Depending on embodiments, the gate dielectric layer 214 has a thickness between 0.8 nm and 2 nm.

In an embodiment, the gate electrode 212 includes one or more layers, where a first layer in contact with the gate dielectric layer 214 is a work function electrode and a second layer in contact with the first is a fill metal. Depending on $S_V$, some gate electrode portions such as gate electrode portion 212A may only include a work function electrode, while gate electrode portions 212B and 212C may include a work function electrode and a fill metal. It is advantageous for the relative space, $S_R$, between surface 204B and surface 206A to have a small as height possible relative to minimize gate capacitance. In embodiments, the height $S_R$, is between 10 nm and 20 nm, to provide sufficient space for gate dielectric layer 214 and gate electrode 212A.

In an embodiment, the source contact 208 is laterally spaced apart from the gate dielectric layer 214 on gate electrode sidewall 212E by a distance $S_1$ and source contact 208 is laterally spaced apart from the gate dielectric layer 214 on gate electrode sidewall 212F by a distance $S_2$. In embodiments, $S_1$ and $S_2$ may be substantially the same. In embodiments, $S_1$ and $S_2$ are at least 3 nm but can be as much as 10 nm.

There may be one or more layers of dielectric material between gate dielectric layer 214 and source contact 208 and between the gate dielectric layer 214 and drain contact 210. In the illustrative embodiment, a dielectric 216 is between gate dielectric layer 214 and source contact 208 directly above and below TMD channel 204, and TMD channel 206. As shown, a dielectric 216 is between gate dielectric layer 214 and drain contact 210 directly above and below TMD channel 204, and TMD channel 206. The dielectric 216 may include silicon oxide, silicon nitride, silicon oxynitride or silicon carbide.

In an embodiment, the TMD channel 204 and TMD channel 206 each have a crystal orientation that is substantially matched to one or more underlying material. In the illustrative embodiment, TMD channel 204 and TMD channel 206 are substantially lattice matched to a plurality of templating and buffer layers where each templating and buffer layer includes a group III-Nitride (III-N) material. In an embodiment, transistor 200 includes a template layer 218 in contact with the source contact 208 and drain contact 210, and buffer layer 220 directly below and in contact with the template layer 218.

In an embodiment, the template layer 218 includes a binary or a ternary III-N material, such as gallium nitride (GaN), one or more ternary alloys of GaN, such as AlGaN, or a quaternary alloy of GaN including at least one group III element and nitrogen, such as $In_XAl_YGa_{1-X-Y}N$, where "X" ranges from 0.01-0.1 and "Y" ranges from 0.01-0.1. In some embodiments, the templating layer 218 includes AlInN The template layer 218 provides a template for hexagonal crystal in TMD channel 204 and TMD channel 206. The template layer 218 is an electrically non-conductive layer. In the illustrative embodiment, gate dielectric layer 214 is in direct contact with an uppermost surface 220A of the template layer.

In an embodiment, the buffer layer 220 includes a single layer of AlN. In embodiments, the thickness of the AlN buffer layer 220 is between 100 nm and 400 nm. In an embodiment, the substrate 202 includes a single crystal silicon, or a silicon on insulator (SIO) substrate.

Figure 2D:
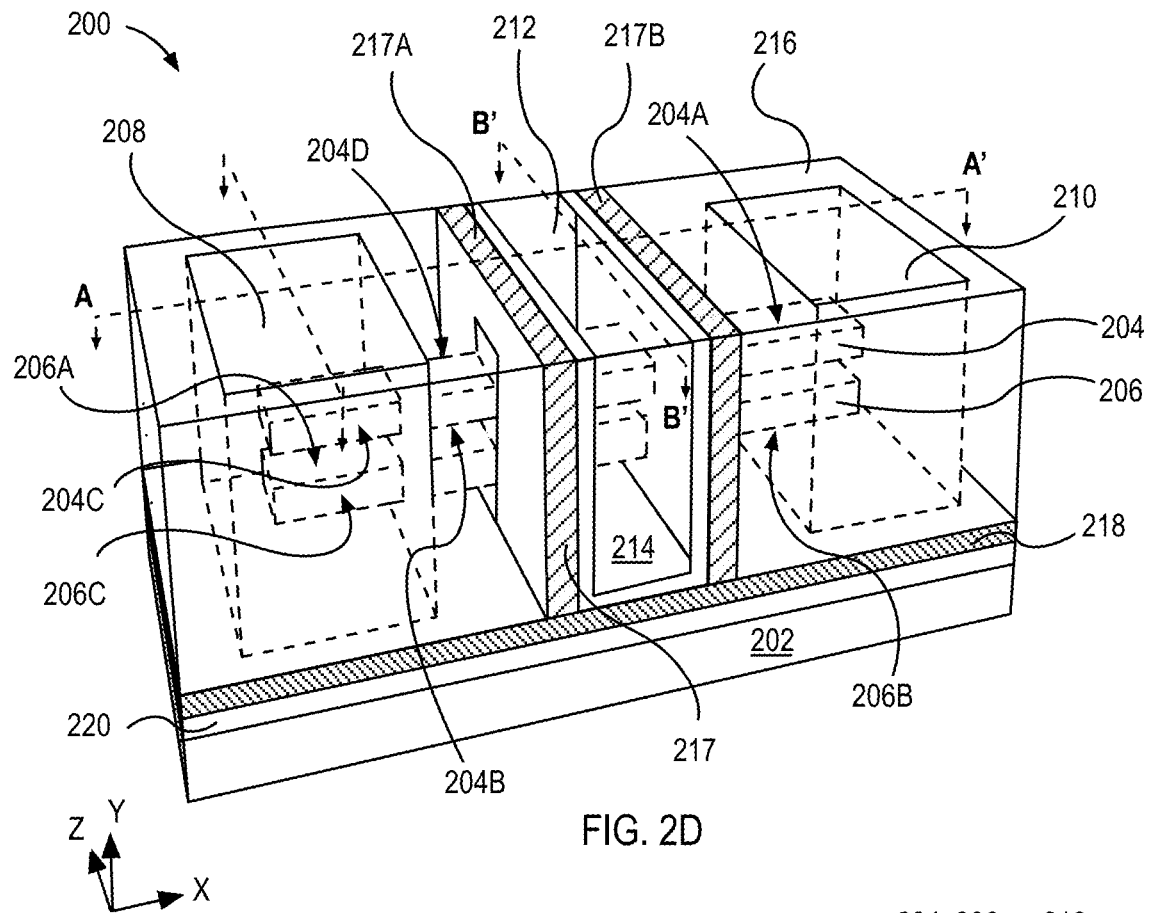
FIG. 2D is an isometric illustration of the transistor in FIG. 2A wherein the transistor includes a first stack of TMD monolayers above a second stack of TMD monolayers.

FIG. 2D is an isometric illustration of a transistor 200 where TMD channel 204 and TMD channel 206 each include between 3-10 monolayers of TMD. The TMD channel 204 and TMD channel 206 may include three dimensional shapes and sidewalls, such as is shown.

As shown there may be more than one dielectric material between gate dielectric layer and contacts. In the illustrative embodiment, there are two dielectric materials between gate dielectric layer 214 and source contact 208 and between gate dielectric layer 214 and drain contact 210. As shown, a dielectric spacer 217 has a dielectric spacer portion 217A that is directly adjacent to gate dielectric layer 214 and between the source contact 208 and the gate dielectric layer 214. As shown, dielectric spacer 217B is directly adjacent to the gate dielectric layer 214 and is between the gate dielectric layer 214 and the drain contact 210. The dielectric spacer 217 is adjacent to sidewalls 204C and 204D of TMD channel 204, and also adjacent to sidewalls 206C and 206D (on opposite side of 206C—not visible in picture) of TMD channel 206. The dielectric spacer 217 may be present directly above TMD channel 204 and TMD channel 206. In the illustrative embodiment, dielectric spacer 217 has a portion that is directly above TMD channel 204. In some such embodiments, dielectric 216 is between the dielectric spacer 217 and TMD channel 204. As shown, dielectric spacer 217 is not in contact with top surface 204A and 206A and bottom surfaces, 204B, and 206B. In other embodiments, dielectric spacer 217 is not above TMD channel 204 and/or TMD channel 206, but adjacent to TMD channel 204 and TMD channel 206.

Source contact 208 and drain contact 210 may extend laterally towards the gate electrode 212. In one embodiment, the source contact 208 can be in direct contact with dielectric spacer portions 217A and the drain contact 210 can be in direct contact with dielectric spacer portion 217B.

In embodiment, the dielectric spacer 217A and 217B includes a material that has a low dielectric constant to reduce capacitance in transistor 200. The dielectric spacer 217A and 217B may include silicon, nitrogen and at least one of oxygen or carbon.

Figure 2E:
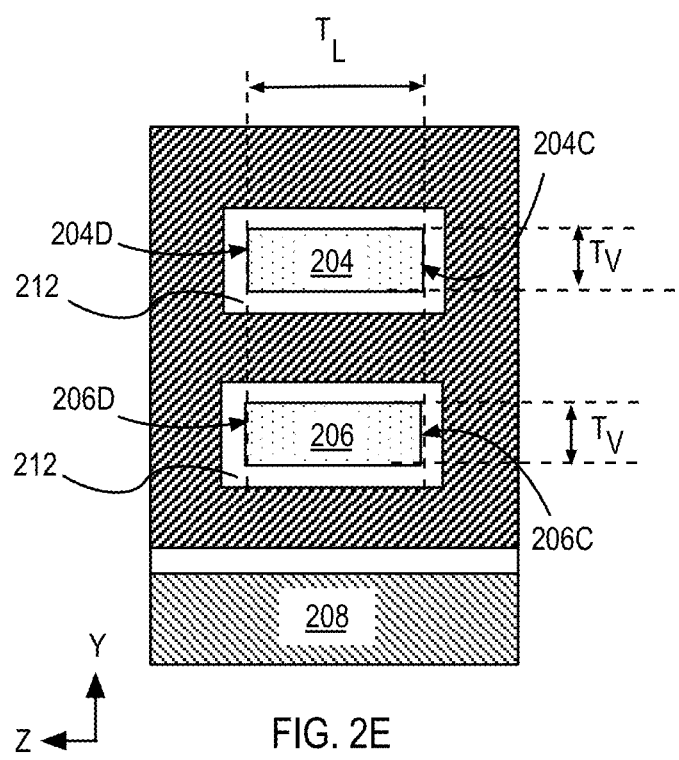
FIG. 2E is a cross-sectional illustration along the line A-A' of the structure in FIG. 2A, illustrating a gate dielectric layer around a plurality of TMD channels and a gate electrode in contact with the gate dielectric layer.

FIG. 2E is a cross-sectional illustration along the line A-A' of the structure in FIG. 2D. As shown, TMD channel 204 and TMD channel 206 each have a thickness, $T_V$, along a Y-direction. As shown, TMD channel 204 and TMD channel 206 each have a lateral thickness, $T_L$, along the Z-direction. In an embodiment, where the TMD channel 204 and TMD channel 206 each include between 3-10 monolayers of TMD material $T_V$, is at least 0.7 nm and as much as 7 nm. $T_L$ is between 2 nm and 10 nm and independent of $T_V$. In the illustrative embodiment, TMD channel 204 and TMD channel 206 are nanoribbons. In other embodiments TMD channel 204 and TMD channel 206 have a substantially square-shaped profile.

Figure 2F:
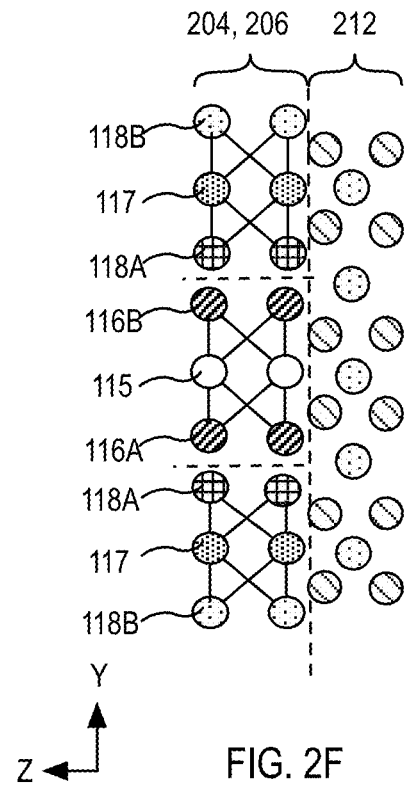
FIG. 2F is a schematic of an end portion representing a sidewall of a first or the second stack of TMD monolayers.

As shown in the cross-sectional illustration, TMD channel 204 has a sidewall 204C and a sidewall 204D opposite to sidewall 204C, and TMD channel 206 has a sidewall 206C and a sidewall 206D opposite to sidewall 206C. It is to be appreciated that while uppermost and lowermost layers of each of the TMD channels 204 and 206 include oxygen for bonding with the gate dielectric layer 212, sidewall characteristics of the TMD channels 204 and 206 are different as illustrated in the schematic of FIG. 2F. In exemplary embodiments, the gate dielectric layer 212 is lattice matched with sidewalls of the TMD channel 204 and TMD channel 206 as shown in the Figure.

Referring again to FIG. 2E, In the illustrative embodiment, gate dielectric layer 214 surrounds TMD channel 204 and TMD channel 206. As shown, gate dielectric layer 214 is directly adjacent to sidewalls 204C and 204D of TMD channel 204 and directly adjacent to sidewalls 206C and 206D of TMD channel 206. In some embodiments, gate dielectric layer 214 has a uniform thickness on sidewalls 204C and 204D and on 206C and 206D. In the illustrative embodiment, the gate electrode 212 surrounds each of TMD channel 204 and TMD channel 206.

Figure 3:
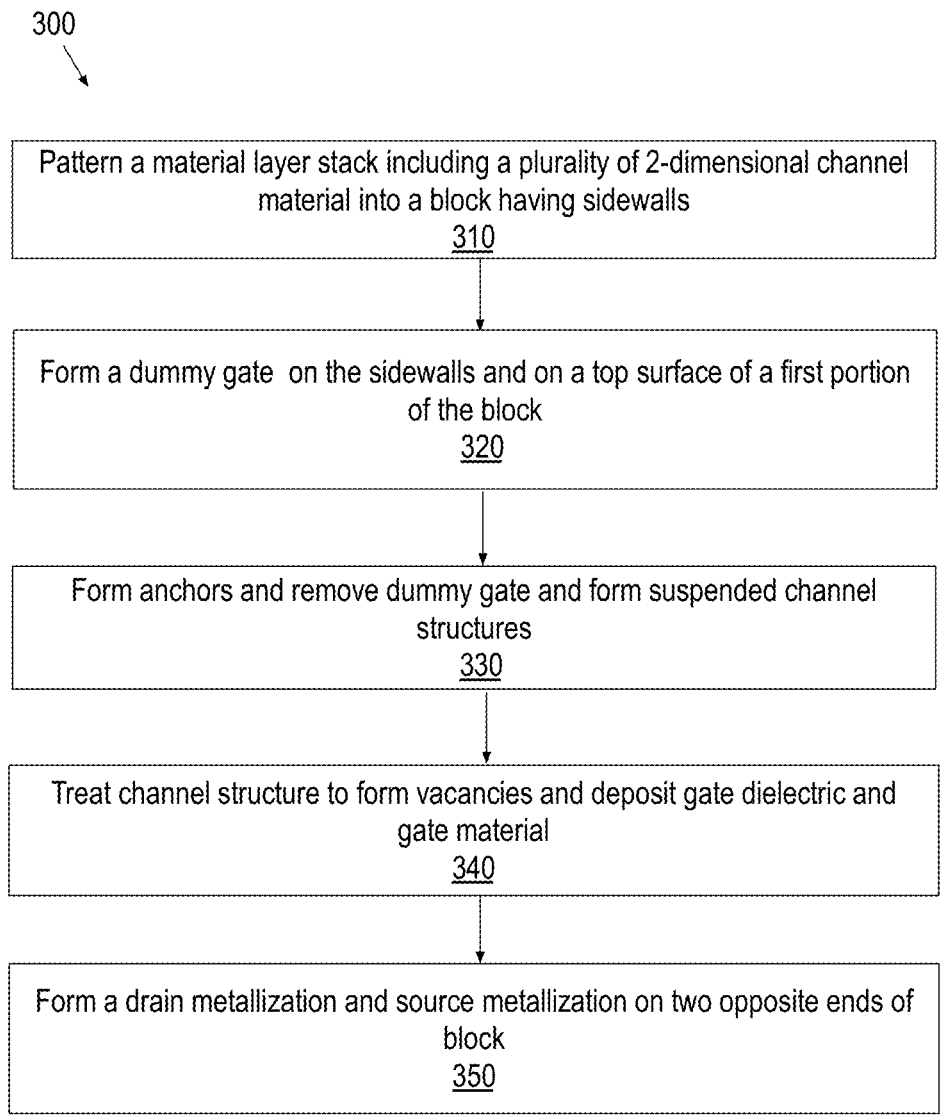
FIG. 3 is a method to fabricate a transistor such as transistor depicted in FIG. 2A, in accordance with an embodiment of the present disclosure.

FIG. 3 is a method 300 to fabricate a transistor such as transistor 200 in accordance with an embodiment of the present disclosure. The method 300 begins at operation 310 with the formation of a material layer stack including a TMD layer above a group III-N material and patterning of the material layer stack into a block. The method 300 continues at operation 320 with the formation of a dummy gate on a first portion of the block and on sidewalls of the block. The method 300 continues at operation 330 with formation of anchors structures on uncovered portions of the block and followed by removal of the dummy gate from the first portion. The method 300 continues at operation 340 with the formation of a gate structure in the first portion. The method concludes at operation 350 with the formation of a source structure on a second portion of the block and a drain structure on a third portion of the block opposite to the second portion.

FIG. 4A is a cross-sectional illustration of material layer stack 400 for fabrication of a TMD transistor device, in accordance with an embodiment of the present disclosure. As shown, a buffer layer 220 is formed on the substrate 202.

In an embodiment, the buffer layer 220 is formed to overcome lattice and thermal mismatch between the substrate 202 and group III-N semiconductor material to be formed above. The buffer layer 220 may be grown on the substrate 202 by a metal organic chemical vapor deposition (MOCVD) process at a temperature in the range of 1000-

1100 degrees Celsius. Depending on embodiments, the buffer layer 220 includes nitrogen and one or more of, Al, In or Ga, for example $Al_zGa_{1-z}N$, $Al_wIn_{1-w}N$, or AlN. In exemplary embodiments buffer layer 220 includes AlN. In an embodiment, an AlN buffer layer 220 has a hexagonal wurtzite structure. The buffer layer 220 including AlN may be grown to a thickness between 25 nm and 100 nm. In other embodiments, the buffer layer 220 includes a plurality of layers of III-N materials above the substrate 202. The layers may be interleaved with two or more layers of III-N materials such as but not limited to $Al_zGa_{1-z}N$, $Al_wIn_{1-w}N$, or AlN.

The template layer 218 is formed on the buffer layer 220. In an embodiment, the template layer 218 is formed by an MOVCD epitaxy process. The template layer 218 is deposited to a thickness between 25 nm and 50 nm. In an embodiment, the template layer 218 is a layer of GaN. In an embodiment, the GaN-template layer 218 is grown to a thickness that is approximately in the range of 100 nm-5 micrometers. A GaN-template layer 218 may have a defect density less than (1e10/cm2) when grown to a thickness of at least 100 nm.

The process continues with formation of a material layer stack 400 having a plurality of bilayers on the template layer 218. In the illustrative embodiment, the material layer stack includes formation of a bilayer 401A followed by formation of bilayer 401B on bilayer 401A. Bilayer 401A includes a layer 402A and a layer 404 which includes a TMD material, herein TMD layer 404 on the layer 402A. Bilayer 401B includes a layer 402B and a layer 405 which includes a TMD material, herein TMD layer 405 on the layer 402B. In the illustrative embodiment, the bilayer 401B is capped by the layer 402C.

In an embodiment, the layers 402A, 402B and 402C include a group III-N material. In an exemplary embodiment, layer layers 402A, 402B and 402C include nitrogen and one or more of Al or In. In an exemplary embodiment, layers 402A, 402B and 402C include AlN. An AlN layer 402A can be grown by MOCVD epitaxially on the template layer 218 and provides a surface for epitaxial growth of the TMD layer 404. In embodiments, TMD layer 404 or 405 have substantially a same crystal structure as an AlN layer 402A or 402B, respectively. In embodiments where the AlN layer 402A or 402B is single crystalline, templating a TMD layer 404 or 405 off the AlN layer 402A or 402B, respectively facilitates optimizing grain size of the TMD layer 404 or 405. The layers 402A, 402B and 402C also provide sufficiently high etch selectivity (greater than 5:1) relative to the template layer 218. The AlN layer 402A is grown to a thickness between 6 nm and 8 nm.

The TMD layer 404 is formed on layer 402A, where TMD layer 404 includes one or more material of the TMD channel 204 or TMD channel 206, described above. In an embodiment, the TMD layer 404 is blanket formed on the layer 402. In embodiments, the number of monolayers of TMD material in the TMD layer 404 is at least 3 but less than or equal to 10. The TMD layer 404 is formed by an MOCVD or a CVD process.

FIG. 4B is a schematic of TMD layers 404 and 405. As shown, TMD layers 404 and 405 include 3 monolayers of TMD material. In the illustrative embodiment, TMD layer 404 includes a TMD monolayer 404A, a TMD monolayer 404B and a TMD monolayer 104 between TMD monolayers 404A and 404B.

In an embodiment, a monolayer of TMD monolayer 404A including a transition metal 117 and chalcogen atom 118A is formed on the layer 402 (not shown). In the illustrative embodiment, 118A chalcogen atoms include sulfur, selenium or tellurium. A TMD monolayer 104, including a transition metal 115 and chalcogen atom 116A is formed on the TMD monolayer 404A. In the illustrative embodiment, 116A chalcogen atom include sulfur, selenium or tellurium. Transition metal 117 may be the same or different from the transition metal 115. The chalcogen atom 116A may include a same species as the species of the chalcogen atom 118A. The process to form TMD monolayer 404B is the same or substantially the same as forming TMD monolayer 404A. In an exemplary embodiment, TMD monolayer 404B includes the same material as a material of the TMD monolayer 404A.

Referring again to FIG. 4A, in an embodiment, the process to form the bilayer 401A is repeated until a desired number of TMD layers is formed. In the illustrative embodiment, a bilayer 401B is formed on the TMD layer 404 of bilayer 401A. The layer 402B in the bilayer 401B is epitaxially formed on TMD layer 404. The thickness of the layer 402B may or may not be equal to the thickness of the layer 402A. The TMD layer 405 may or may not include a same material as the material of TMD layer 404 or have the same number of monolayers as TMD layer 404. In an exemplary embodiment, the TMD layer 405 is substantially the same as TMD layer 404, i.e., TMD layer 405 includes a same material as TMD layer 404 and has a same number of monolayers as TMD layer 404.

As shown in FIG. 4C, TMD layer 405 includes a TMD monolayer 405A, a TMD monolayer 405B and a TMD monolayer 104 between TMD monolayers 405A and 405B. In an exemplary embodiment, TMD monolayers 405A and 405B are the same or substantially the same as TMD monolayers 404A and 404B, described above.

Referring again to FIG. 4A, the material layer stack 400 further includes a layer 402C formed on the bilayer 401B. While two bilayers 401A and 401B are shown, the number of layers can be between 2-5.

FIG. 5A is a cross sectional illustration of a block 406 formed by patterning the material layer stack 400. In an embodiment, a plasma etch process may be utilized to form the block 406. In exemplary embodiments, the sidewalls 406A and 406B may be substantially vertical as shown. The patterning process carried out etches the lowermost layer 402 directly adjacent template layer 218. The etch process is halted after exposure of the template layer 218. Patterning of TMD layers 404 and 405 forms TMD channel 204 and TMD channel 206, respectively.

Figure 5B:
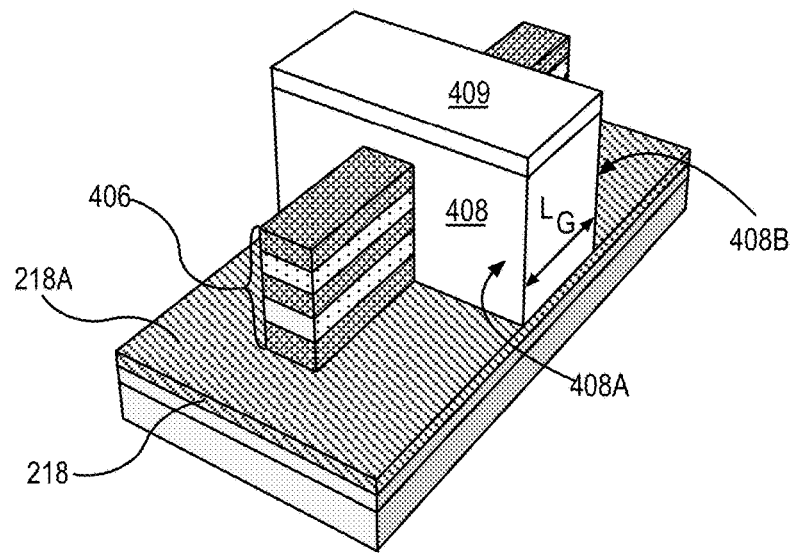
FIG. 5B is an isometric illustration of the structure in FIG. 5A following the formation of a dummy gate structure on a first portion of the block.

FIG. 5B is an isometric illustration following the formation of a dummy gate structure 410 formed on a first portion of the block 406. In an embodiment, a dummy gate dielectric layer such as silicon oxide, or $Al_2O_3$, is blanket deposited on the block 406 and on the template layer 218 and a dummy gate material is deposited on the dummy gate dielectric. In an embodiment, a mask 409 is formed on the dummy gate material. The mask 409 may include silicon nitride, silicon oxynitride or silicon carbide. In an embodiment, a plasma etch process is utilized to pattern the dummy gate material into dummy gate structure 408, selective to an uppermost surface 218A of the template layer 218, and the mask 409, as shown. In an embodiment, the dummy gate structure 408 has sidewalls 408A and 408B that are substantially vertical relative to an uppermost surface of template layer 218. The dummy gate structure 408 has a lateral width, LG. LG defines a width of a transistor gate that is to be formed.

Figure 5C:
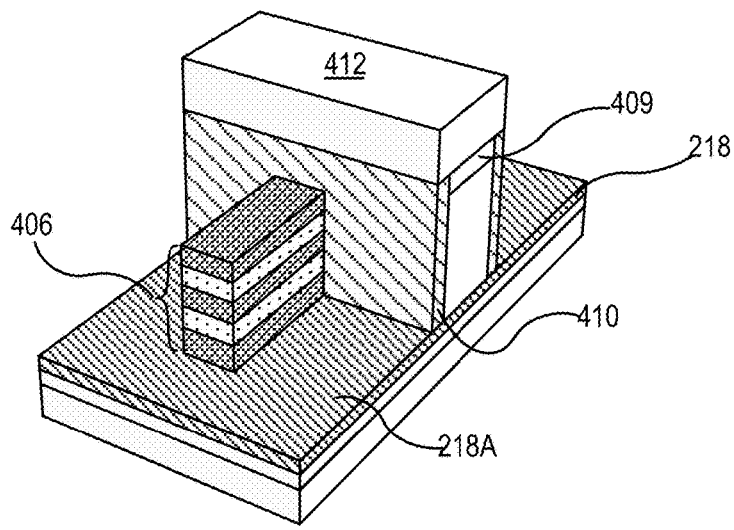
FIG. 5C is an isometric illustration of the structure in FIG. 5B following the formation of a dielectric spacer adjacent to the dummy gate structure.

FIG. 5C is an isometric illustration of the structure in FIG. 5B following the formation of a dielectric spacer 410 adjacent to the dummy gate structure 408 and mask 409. In an embodiment, a dielectric spacer layer is blanket deposited on the block 406 and on the mask 409. The deposition process utilized may include a PECVD (plasma enhanced chemical vapor deposition), physical vapor deposition (PVD), chemical vapor deposition (CVD) process. In an embodiment, the dielectric spacer layer includes silicon and nitrogen and/or carbon.

In an embodiment, the dielectric spacer layer is planarized. The planarization process may expose an uppermost surface of the dummy gate structure 408. As shown, a mask 412 is formed over the mask 409 and over a portion of the dielectric spacer layer. The dielectric spacer layer is etched to form dielectric spacer 410. A plasma etch may be utilized to pattern the dielectric spacer 410. An over etch of the dielectric spacer layer is carried out to remove the dielectric spacer layer from sidewall portions of the block 406 that are not covered by the mask.

In the illustrative embodiment, the dielectric spacer 410 is formed on sidewall portions of the block 406 directly adjacent to the dummy gate structure 408. As shown, the dummy gate structure 408 and the dielectric spacer 410 both cover portions of the sidewalls of the block 406.

The dielectric spacer 410 may be formed to a thickness that is determined by downstream process, electrical performance (such as modulating external resistance) or a combination thereof. In an embodiment, the spacer has a lateral width between 5 nm to 10 nm.

Figure 5D:
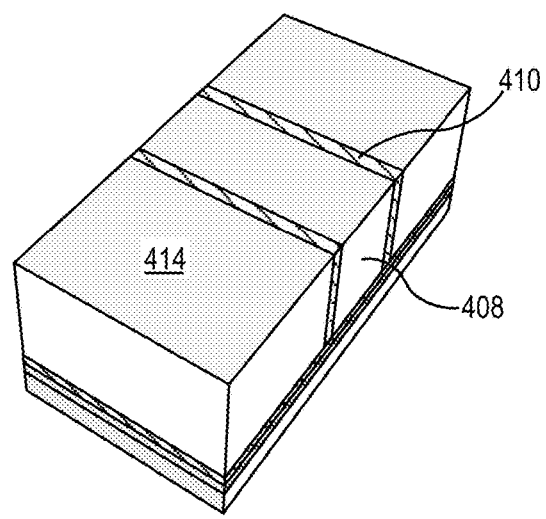
FIG. 5D illustrates the structure of FIG. 5C following the formation of a dielectric on exposed portions of the block, on the dielectric spacer, and above uppermost surface of the dummy gate structure.

FIG. 5D illustrates the structure of FIG. 5C following the formation of a dielectric 414 on the exposed portions of the block 406, on the dielectric spacer 410, and on a top surface of the mask 409 (not shown). In an embodiment, the dielectric 414 is deposited by a blanket deposited using a physical vapor deposition (PVD) or a chemical vapor deposition (CVD) process. In an embodiment, a chemical mechanical polish (CMP) process is utilized to planarize the dielectric 414. In an embodiment, the mask 409 is removed by the CMP process to facilitate removal of material of dummy gate.

FIG. 6A illustrates the structure of FIG. 5A following the process to remove the dummy gate structure 408 and portions of the layer 402 exposed after removal of the dummy gate structure 408.

In an embodiment, where the dummy gate structure 408 includes a material such as polysilicon, silicon germanium, germanium, a combination of plasma etch, and wet chemical etch can be utilized to remove the dummy gate structure 408. In an embodiment, the dummy gate material is removed after removing the dummy gate material. Removal of the dummy gate structure 408 forms an opening 600 as illustrated. In an embodiment, removal of the dummy gate structure 408 does not appreciably alter the lateral width of the spacer 410.

After formation of opening 600, portions of the layer 402A, 402B and 402C are selectively removed. The extent of lateral etching (along the X-Z plane) of layers 402A, 402B and 402C may depend on the method utilized to etch. In an embodiment, a wet chemical process is utilized. The wet etch chemistry may selectively etch 402A, 402B and 402C with respect to TMD layers 402A and 402B, dielectric spacer 410, template layer 218 and dielectric 414. In an embodiment, the wet etch process etches the various layers 402 in the opening 600 and not under the spacer as shown. As shown, the layers 402A, 402B and 402C are substantially aligned with sidewalls 410A of dielectric spacer 410.

After exposing a plurality of surfaces of TMD channel 204 and TMD channel 206, a process to and "sacrifice" outer layers by breaking the outer-most M-X bonds (M=Mo, W, etc.; X=S, Se, etc.) is performed. Breaking of bonds between transition metal atoms and chalcogen atoms (or M-X bonds). In an embodiment, breaking of M-X bonds enables sites for nucleation of pin-hole free, conformal, highly crystalline gate dielectric layer having a high-K to be grown on TMD surfaces. In an embodiment, exposed surfaces of the TMD channels 204 and 206 may be fully or partially oxidized or functionalized. In some embodiments a UV-ozone treatment or a downstream plasma exposure at low pressures in presence of oxygen gas can oxidize exposed surfaces of the TMD channels 204 and 206.

FIG. 6B is a cross-sectional illustration of the structure in FIG. 6A through a line A-A'. In the Figure, surfaces 204A and 204B of TMD channel 204 and surfaces 206A and 206B of TMD channel 206 are exposed to UV ozone or plasma.

FIG. 6C is a schematic of the TMD channel 204 or 206 following the process to break the M-X bonds, in accordance with an embodiment of the present disclosure. A schematic of TMD channel 204 or 206 prior to breaking the bonds is illustrated in FIG. 4B, where the TMD channel 204 or 206 are substantially the same as TMD layers 404 and 405 prior to patterning.

As shown in FIG. 6B, chalcogen atoms of surfaces 204A or 206A and 206B or 206B are altered after the ozone or plasma exposure. Chalcogen atoms 118A are not oxygen. In an embodiment, one or more chalcogen atoms 118A of a lowermost TMD monolayer 404A of TMD 204 or 206, are replaced by one or more oxygen atoms 118B. In the illustrative embodiment, at least 30% of the non-oxygen chalcogen atoms are replaced by oxygen. In an embodiment, one or more chalcogen atoms 118A of an uppermost TMD monolayer 404B of TMD 204 or 206, are replaced by one or more oxygen atom 118B. In the illustrative embodiment, at least 30% of the non-oxygen chalcogen atoms are replaced by oxygen.

In an embodiment, the broken and dangling bond site 417 serve as nucleation sites for a downstream deposition process for forming a gate dielectric layer.

While not shown, in some embodiments, the chalcogen atoms 118A in the TMD monolayer 404A and in 404B directly adjacent to the TMD monolayer 104 are also partially or fully replaced by oxygen atoms 118B. Depending on an extent of oxidation of the TMD FIG. 7A illustrates the structure of FIG. 6A following the formation of a gate dielectric layer 418 in the opening 600 and formation of a gate electrode 420 on the gate dielectric layer 418.

In an embodiment, gate dielectric layer 418 is blanket deposited in the opening 600, on the dielectric spacer 410 and on the dielectric 414. As shown, dielectric spacer 410 is formed on all exposed surfaces of TMD layers in the opening 600, on the template layer 218 and on sidewalls 410A of spacer 410. In an embodiment, the gate dielectric layer 418 is deposited using an atomic layer deposition (ALD) process. The gate dielectric layer 418 may be deposited to a thickness of 0.8 nm to 2 nm. After formation of the gate dielectric layer 418, one or more layers of gate electrode material is blanket deposited in the opening 600, on the gate dielectric layer 418. After deposition, the one or more layers of gate electrode material and gate dielectric layer 418 may be planarized. In an embodiment, the planarization process is utilized to remove any excess gate electrode material and gate dielectric layer 418 from uppermost surfaces of the dielectric 414, and dielectric spacer 410. The planarization process forms a gate electrode 420.

FIG. 7B is a cross-sectional illustration through a line A-A' in FIG. 7A. In the illustrative embodiment, the gate dielectric layer 418 is deposited on top surface 206C, bottom surface 206D, and sidewall surfaces 206E and 206F of the TMD layer 206 and on top surface 204A, bottom surface 204B, and sidewall surfaces 204C and 204D of TMD layer 204. In an embodiment, the ALD deposition process provides a sufficiently uniform thickness of gate dielectric layer 418 on all surfaces of the TMD channel 204 and TMD channel 206. As shown in the cross-sectional illustration, the gate electrode 420 is adjacent to all exposed surfaces of the gate dielectric layer 418.

FIG. 7C is a cross-sectional illustration of the structure in FIG. 7A along the line B-B'. In the illustrative embodiment, the layers 402A, 402B and 402C are not recessed under dielectric spacer sidewall 410A. In some such embodiments, the gate dielectric layer is uniformly formed on the surfaces 204A, 204B, 206A and 206B and does not extend under dielectric spacer 410. As shown, dielectric spacer 410 is formed adjacent to gate dielectric layer 418. In the illustrative embodiment, the gate electrode 420 does not extend under the dielectric spacer 410.

FIG. 7D is a schematic of the TMD channel 204 or 206, following the process to deposit a gate dielectric layer 418. In an embodiment, the broken and dangling bond site 417 on both TMD channels 204 and 206 on (upper surface 204A and 206A and lower surfaces 204B and 206B) serve as nucleation sites for the gate dielectric layer 600. In an embodiment, oxygen from a material of the gate dielectric layer 418, such as $HfO_2$, for example, adheres to vacancies during the deposition process, forming a stable bond. As discussed in association with FIG. 2F above, oxygen from the deposition material also adheres to sidewalls of the TMD material in the channels 204 and 206.

Figure 8A:
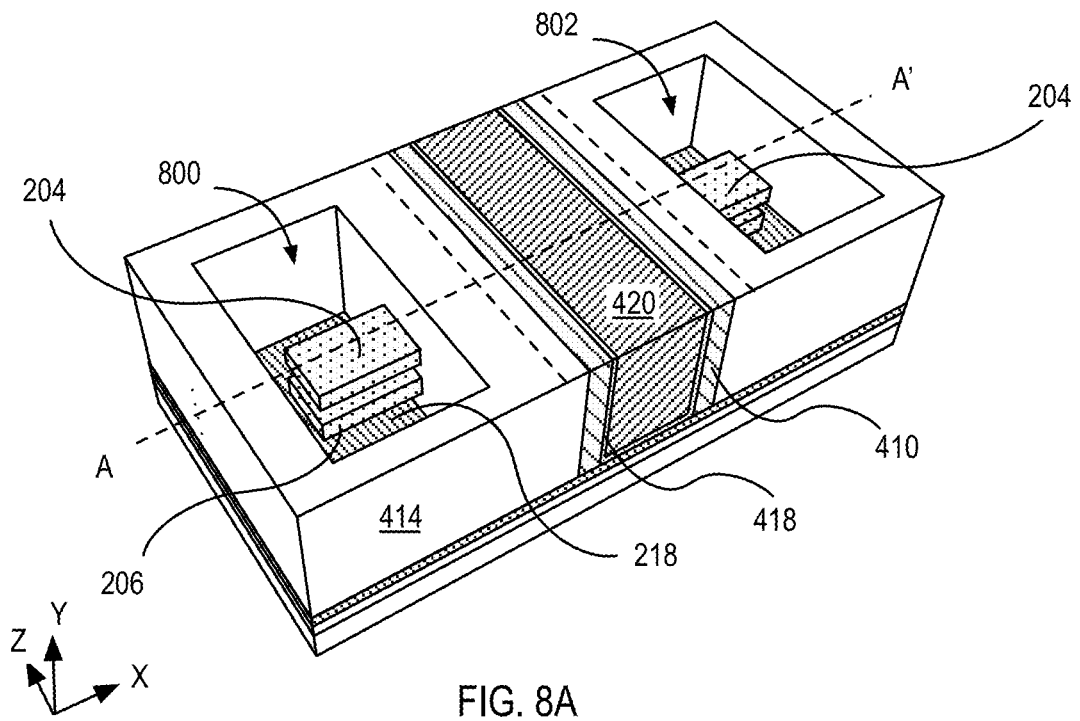
FIG. 8A illustrates the structure of FIG. 6A following the formation of a first opening and a second opening in the dielectric to expose two opposing ends of the first and second TMD channels.

FIG. 8A illustrates the structure of FIG. 7A following the formation of openings 800 in the dielectric 414 to form source and drain contacts. In the illustrative embodiment, an opening 800 is formed to expose one end of the TMD layer 204 and an opening 802 is formed to expose a second end of the TMD layer 204. I am embodiment, a plasma etch process is utilized to form openings 800 and 802 after the formation of a mask on the dielectric 414, on the dielectric spacer 410, on the gate dielectric layer 418 and on the gate electrode 420. In an embodiment, the openings 800 and 802 can extend to dielectric spacer sidewalls 410B. In an embodiment, the dielectric 414 is etched by a plasma etch process to form openings 800 and 802. In an embodiment, the plasma etch is isotropic and removes the dielectric 414 between the TMD layer 204 and 206, as shown.

In an embodiment, prior to formation of the openings 800 and 802, the layers 402A and 402B (not shown in the Figure) are etched and removed by a wet chemical or a vapor etch process. In other embodiments the layers 402A and 402B are removed after formation of openings 800 and 802.

Figure 8B:
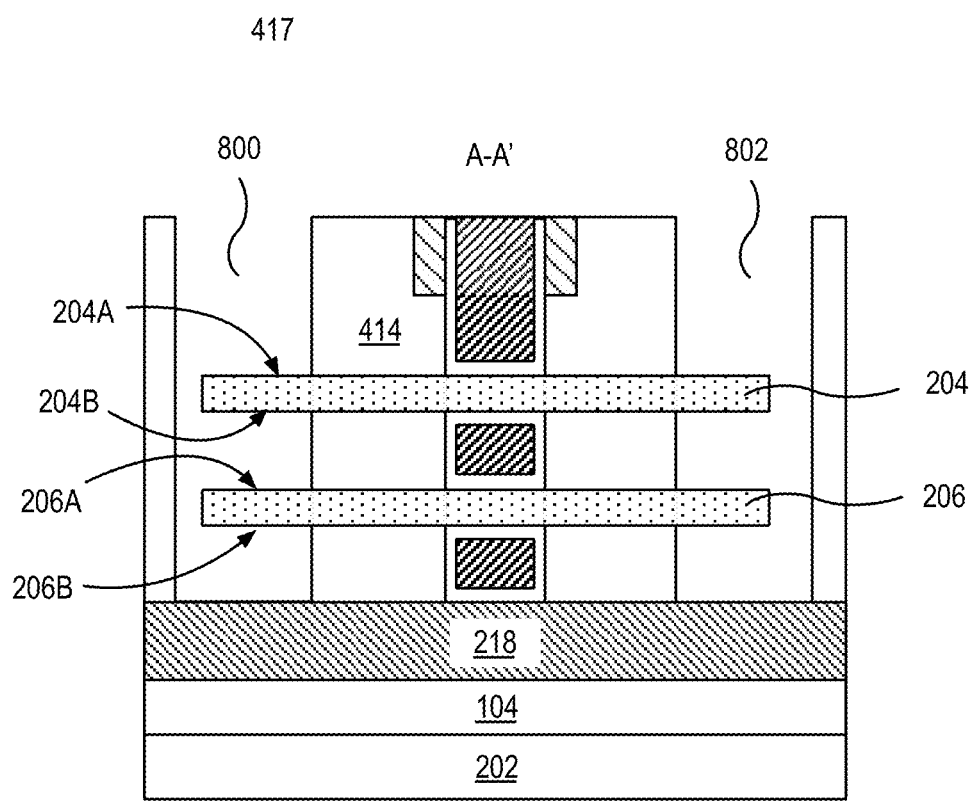
FIG. 8B is a cross-sectional illustration of the structure in FIG. 7A through a line A

FIG. 8B is a cross-sectional illustration of the structure in FIG. 8A through the line A-A'. In the illustrative embodiment, the layers 402A (between TMD layer 204 and 206) and 402B (between TMD layer 206 and template layer 218—not shown in the Figure) are etched and removed by a wet chemical or a vapor etch process prior to formation of the opening 800 and 802. Portions of surfaces 204A, 204B, 206A and 206B are exposed after formation of opening 800 and 802 as shown in the cross-sectional illustration. Surfaces 204A, 204B of TMD channel 204 and surfaces 206A and 206B of TMD channel 206 are not chemically treated (i.e. subject to UV ozone or oxidation treatment) in openings 800 and 802 and remain substantially stoichiometric.

Figure 9:
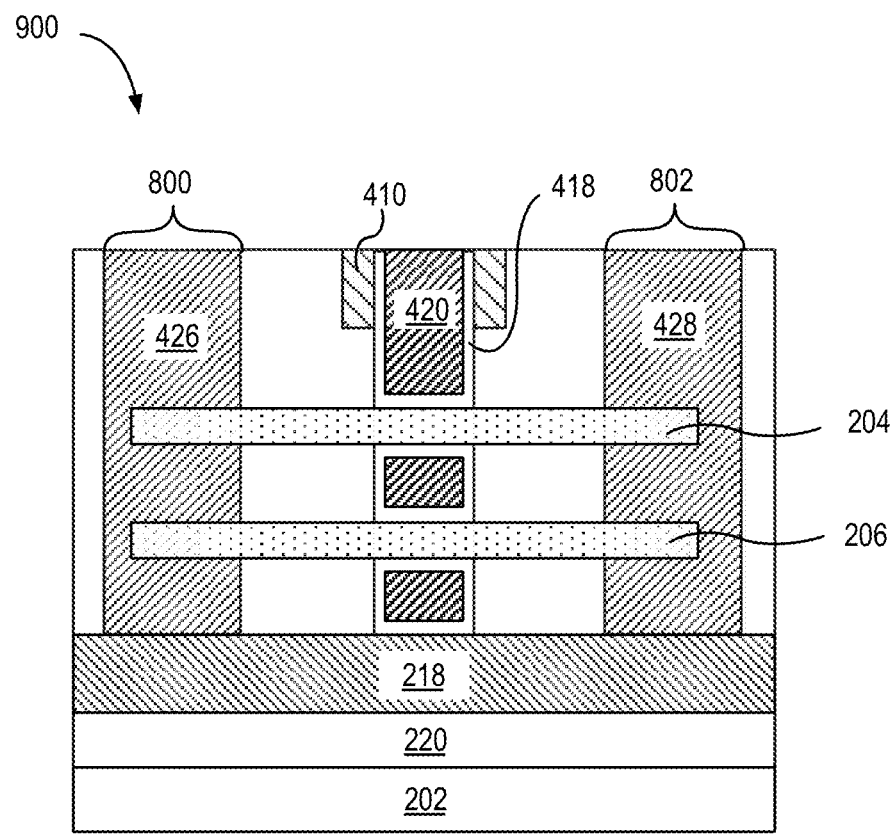
-FIG. 9 illustrates the structure of FIG. 7B following the formation of source contact in the first opening in the dielectric and a drain contact in the second opening in the dielectric.

FIG. 9 illustrates the structure of FIG. 8A following the formation of source contact 426 and drain contact 428 in the openings 800 and 802, respectively to form transistor 900. In an embodiment, one or more layers of contact material are blanket deposited on exposed surfaces of the TMD layer 206 and 204 and on uppermost surface of the dielectric 414, dielectric spacer 410, gate dielectric layer 418, gate electrode 420, and template layer 218. In an embodiment, the contact material includes one or more materials that are substantially the same as the material of the source contact 206 and drain contact 108 described above. In an embodiment, a first of the one or more contact material is epitaxial to the monocrystalline TMD layers 206 and 204.

In an embodiment, a planarization process is utilized to remove the excess one or more layers of contact material formed on uppermost surface of the dielectric 414, dielectric spacer 410, gate dielectric layer 418 and gate electrode 420. The planarization process forms source contact 426 and drain contact 428.

FIG. 10A illustrates a cross-sectional view of a memory cell 1000 including a nanowire transistor with a plurality of TMD channels, such as the transistor 200 described in association with FIGS. 1A and 1B, and a non-volatile memory element 1002 coupled to a contact of the transistor 200. In the illustrative embodiment, the non-volatile memory element 1002 is coupled to the drain contact 210 of the transistor 200.

Non-volatile memory element 1002 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 200, which can provide an additional current boost (through increase in drive current), can be advantageously coupled to non-volatile memory element 1002 such as an MTJ device to overcome any larger critical switching current requirements.

FIG. 10B illustrates a cross-sectional view of an example non-volatile memory element 1002 that includes a magnetic tunnel junction (MTJ) material device. In the illustrated embodiment, the MTJ device includes a bottom electrode 1004, a fixed magnet 1006 above the bottom electrode 1004, a tunnel barrier 1008 on the fixed magnet 1006, a free magnet 1010 on the tunnel barrier 1008, and a top electrode 1012 on the free magnet 1010. In an embodiment, a dielectric spacer laterally surrounds (not shown) non-volatile memory element 1002.

In an embodiment, fixed magnet 1006 includes a material and has a thickness sufficient for maintaining a fixed magnetization. For example, fixed magnet 1006 may include an alloy such as CoFe and CoFeB. In an embodiment, fixed magnet 1006 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1006 is FeB, where the concentration of boron is between 10 and 40 atomic percent of the total composition of the FeB alloy. In an embodiment, the fixed magnet 1006 has a thickness that is between 1 nm and 2.5 nm.

In an embodiment, tunnel barrier 1008 is composed of a material suitable for allowing electron current having a majority spin to pass through tunnel barrier 1008, while impeding, at least to some extent, electron current having a minority spin from passing through tunnel barrier 1008. Thus, tunnel barrier 1008 (or spin filter layer) may also be referred to as a tunneling layer for electron current of a particular spin orientation. In an embodiment, tunnel barrier 1008 includes a material such as, but not limited to, magnesium oxide (MgO) or aluminum oxide ($Al_2O_{10}$). In an embodiment, tunnel barrier 1008 including MgO has a crystal orientation that is (001) and is lattice matched to free magnet 1010 below tunnel barrier 1008 and fixed magnet 1006 above tunnel barrier 1008. In an embodiment, tunnel barrier 1008 is MgO and has a thickness is between 1 nm to 2 nm.

In an embodiment, free magnet 1010 includes a magnetic material such as Co, Ni, Fe or alloys of these materials. In an embodiment, free magnet 1010 includes a magnetic material such as FeB, CoFe and CoFeB. In an embodiment, free magnet 1010 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1010 is FeB, where the concentration of boron is between 10 and 40 atomic percent of the total composition of the FeB alloy. In an embodiment, free magnet 1010 has a thickness that is between 1 nm and 2.0 nm.

In an embodiment, bottom electrode 1004 includes an amorphous conductive layer. In an embodiment, bottom electrode 1004 is a topographically smooth electrode. In an embodiment, bottom electrode 1004 includes a material such as W, Ta, TaN or TiN. In an embodiment, bottom electrode 1004 is composed of Ru layers interleaved with Ta layers. In an embodiment, bottom electrode 1004 has a thickness between 20 nm and 50 nm. In an embodiment, top electrode 1012 includes a material such as W, Ta, TaN or TiN. In an embodiment, top electrode 1012 has a thickness between 30 nm and 70 nm. In an embodiment, bottom electrode 1004 and top electrode 1012 are the same metal such as Ta or TiN. In an embodiment, the MTJ device has a combined total thickness of the individual layers is between 60 nm and 100 nm and a width is between 10 nm and 50 nm.

Referring again to FIG. 10A, in an embodiment, non-volatile memory element 1002 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 200, that can provide an additional current boost (through increase in drive current), can be advantageously coupled to an RRAM device to provide reliable switching operation.

FIG. 10C illustrates a cross-sectional view of an example non-volatile memory element 1002 that includes a resistive random-access memory (RRAM) device. In the illustrated embodiment, the RRAM material stack includes a bottom electrode 1014, a switching layer 1016 over the bottom electrode 1014, an oxygen exchange layer 1018 over the switching layer 1016, and a top electrode 1020 on the oxygen exchange layer 1018.

In an embodiment, bottom electrode 1014 includes an amorphous conductive layer. In an embodiment, bottom electrode 1014 is a topographically smooth electrode. In an embodiment, bottom electrode 1014 includes a material such as W, Ta, TaN or TiN. In an embodiment, bottom electrode 1014 is composed of Ru layers interleaved with Ta layers. In an embodiment, bottom electrode 1014 has a thickness is between 20 nm and 50 nm. In an embodiment, top electrode 1020 includes a material such as W, Ta, TaN or TiN. In an embodiment, top electrode 1020 has a thickness is between 100 and 70 nm. In an embodiment, bottom electrode 1014 and top electrode 1020 are the same metal such as Ta or TiN.

Switching layer 1016 may be a metal oxide, for example, including oxygen and atoms of one or more metals, such as, but not limited to Hf, Zr, Ti, Ta or W. In the case of titanium or hafnium, or tantalum with an oxidation state +4, switching layer 1016 has a chemical composition, $MO_X$, where O is oxygen and X is or is substantially close to 2. In the case of tantalum with an oxidation state +5, switching layer 1016 has a chemical composition, $M_2O_X$, where O is oxygen and X is or is substantially close to 5. In an embodiment, switching layer 1016 has a thickness is between 1 nm and 5 nm.

Oxygen exchange layer 1018 acts as a source of oxygen vacancy or as a sink for 0'. In an embodiment, oxygen exchange layer 1018 is composed of a metal such as but not limited to, hafnium, tantalum or titanium. In an embodiment, oxygen exchange layer 1018 has a thickness is between 5 nm and 20 nm. In an embodiment, the thickness of oxygen exchange layer 1018 is at least twice the thickness of switching layer 1016. In another embodiment, the thickness of oxygen exchange layer 1018 is at least twice the thickness of switching layer 1016. In an embodiment, the RRAM device has a combined total thickness of the individual layers is between 60 nm and 100 nm and width is between 10 nm and 50 nm.

Referring again to FIG. 10A, the memory device 1002 is coupled to the transistor 200 through interconnect structures at a level 1022 above the transistor. In an embodiment, level 1022 includes a single level of interconnects coupled with the transistor 200. In other embodiments, level 1022 includes a plurality of sublevels of interconnect routing structures.

In the illustrative embodiment, the memory cell 1000 includes a drain interconnect 1024 between the memory device 1002 and the drain contact 210. As shown, the drain interconnect 1024 is on and coupled with the drain contact 210. The memory cell 1000 further includes a source interconnect 1026 coupled with the source contact 208 and gate interconnect 1028 coupled with the gate 212. In other embodiments, a gate contact is between the gate 112 and the gate interconnect 1028. The memory device 1002 is further coupled to a memory interconnect 1030.

In an embodiment, source interconnect 1026, gate interconnect 1028 and drain interconnect 1024 are embedded in a dielectric layer 1032. In an embodiment, the source interconnect 1026, gate interconnect 1028, drain interconnect 1024 and memory interconnect 1030 each include titanium, tantalum, tungsten, ruthenium, copper, or nitrides of titanium, tantalum, tungsten, ruthenium. In other embodiments the source interconnect 1026, gate interconnect 1028, drain interconnect 1024 and memory interconnect 1030, include a liner layer including ruthenium or tantalum and a fill metal such as copper or tungsten. In the illustrative embodiment, the memory device 1002 and the memory interconnect 1030 is embedded in a dielectric 1034.

In an embodiment, the level 1022 further includes a barrier dielectric layer 1036 between the dielectric 1032 and dielectric 1034. In embodiments dielectric 1032 and 1034 include silicon and one or more of nitrogen, oxygen and carbon such as, silicon nitride, silicon dioxide, carbon doped silicon nitride, silicon oxynitride or silicon carbide.

In embodiments, dielectric 1036 includes silicon and one or more of nitrogen and carbon such as, silicon nitride, carbon doped silicon nitride or silicon carbide.

Figure 11:
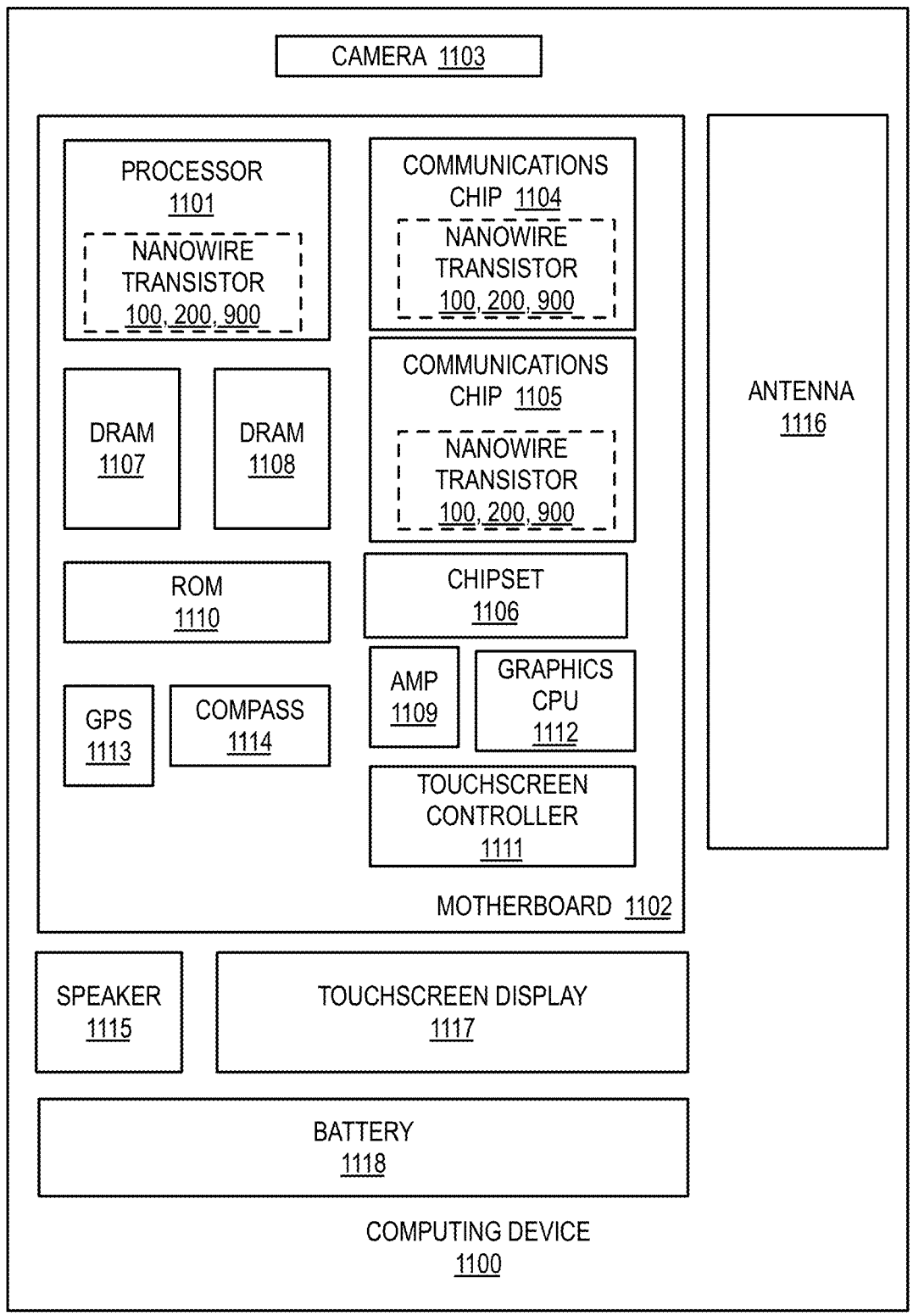
FIG. 11 illustrates a computing device in accordance with embodiments of the present disclosure.

FIG. 11 illustrates a computing device 1100 in accordance with embodiments of the present disclosure. As shown, computing device 1100 houses a motherboard 1102. Motherboard 1102 may include a number of components, including but not limited to a processor 1101 and at least one communications chip 1104 or 1105. Processor 1101 is physically and electrically coupled to the motherboard 1102. In some implementations, communications chip 1105 is also physically and electrically coupled to motherboard 1102. In further implementations, communications chip 1105 is part of processor 1101.

Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset 1106, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1105 enables wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1105 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1100 may include a plurality of communications chips 1104 and 1105. For instance, a communications chip 1105 may be dedicated to shorter range wireless communications such as Wi-Fi and Bluetooth and a communications chip 1104 may be dedicated to longer range wireless communications such as GPS, EDGE, GPRS, CDMA, WiMAX, LTE, Ev-DO, and others.

Processor 1101 of the computing device 1100 includes an integrated circuit die packaged within processor 1101. In some embodiments, the integrated circuit die of processor 1101 includes one or more interconnect structures, non-volatile memory devices, and transistors such as TMD transistors 100, 200 or 900 described in association with FIG. 1A, 2A or 9, respectively. Referring again to FIG. 11, the term "processor" may refer to any device or portion of a device that processes electronic data from registers and/or memory to transform that electronic data into other electronic data that may be stored in registers and/or memory.

Communications chip 1105 also includes an integrated circuit die packaged within communication chip 1105. In another embodiment, the integrated circuit die of communications chips 1104, 1105 includes one or more interconnect structures, non-volatile memory devices, capacitors and transistors such as TMD transistors 100, 200 or 900, described above. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics CPU 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1100 and discussed above may contain a stand-alone integrated circuit memory die that includes one or more arrays of NVM devices.

In various implementations, the computing device 1100 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
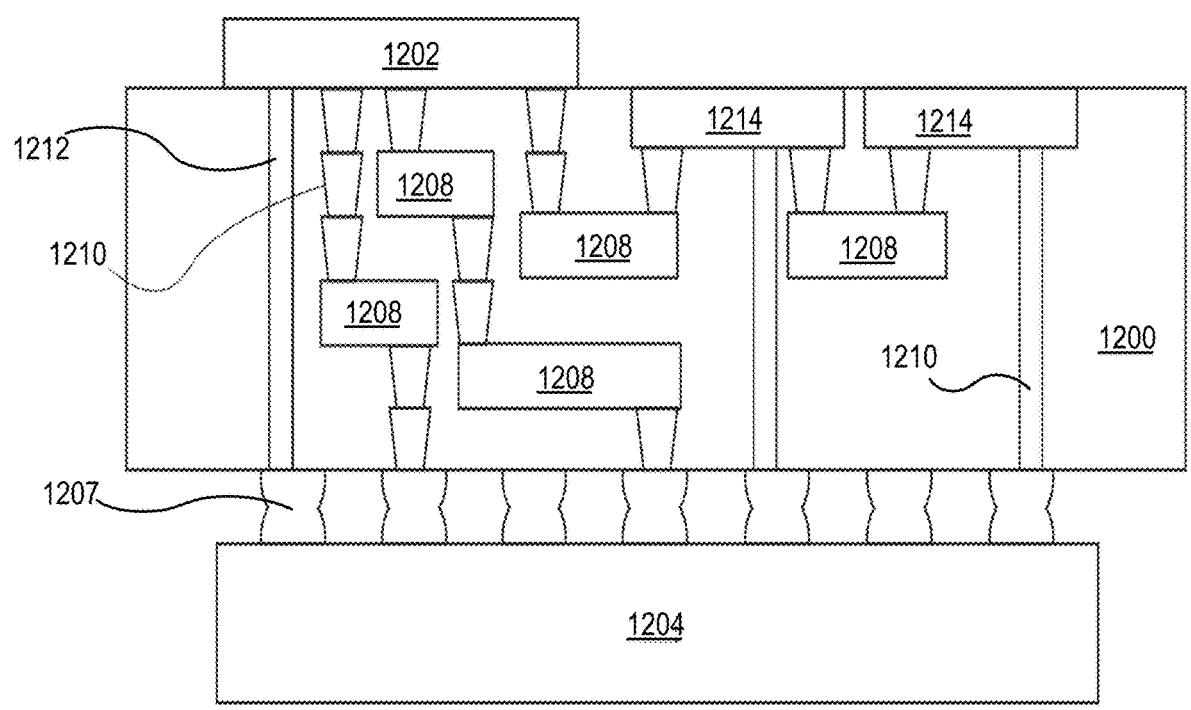
FIG. 12 illustrates an integrated circuit (IC) structure that includes one or more embodiments of the present disclosure.

FIG. 12 illustrates an integrated circuit (IC) structure 1200 that includes one or more embodiments of the disclosure. The integrated circuit (IC) structure 1200 is an intervening substrate used to bridge a first substrate 1202 to a second substrate 1204. The first substrate 1202 may be, for instance, an integrated circuit die. The second substrate 1204 may be, for instance, a memory module, a computer mother, or another integrated circuit die. Generally, the purpose of an integrated circuit (IC) structure 1200 is to spread a connection to a wider pitch or to reroute a connection to a different connection. For example, an integrated circuit (IC) structure 1200 may couple an integrated circuit die to a ball grid array (BGA) 1207 that can subsequently be coupled to the second substrate 1204. In some embodiments, the first substrate 1202 and the second substrate 1204 are attached to opposing sides of the integrated circuit (IC) structure 1200. In other embodiments, the first substrate 1202 and the second substrate 1204 are attached to the same side of the integrated circuit (IC) structure 1200. And in further embodiments, three or more substrates are interconnected by way of the integrated circuit (IC) structure 1200.

The integrated circuit (IC) structure 1200 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1208 and vias 1210, including but not limited to through-silicon vias (TSVs) 1212. The integrated circuit (IC) structure 1200 may further include embedded devices 1214, including both passive and active devices. Such embedded devices 1214 include transistors, resistors, inductors, fuses, diodes and transformers. Such embedded devices 1214 further include capacitors and transistors such as TMD transistors 100, 200 or 900 described in association with FIG. 1A, 2A or 9, respectively. Referring again to FIG. 12, the integrated circuit (IC) structure 1200 may further include embedded devices 1214 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1200.

Thus, one or more embodiments of the present disclosure relate to TMD stacked layers for transistor application as described above. The transistors including TMD stacked layers may be used in various integrated circuit applications.

In a first example, a transistor includes a channel including a first layer including a first monocrystalline transition metal dichalcogenide (TMD) material, where the first layer is stoichiometric and includes a first transition metal and a second layer above the first layer, the second layer including a second monocrystalline TMD material, where the second monocrystalline TMD material includes a second transition metal and oxygen, and where the second layer is sub-stoichiometric. The transistor further includes a gate electrode above a first portion of the channel layer, a gate dielectric layer between the channel layer and the gate electrode, a source contact on a second portion of the channel layer and a drain contact on a third portion of the channel layer, where the gate electrode is between drain contact and the source contact.

In second examples, for any of first examples, the second TMD material further incudes a chalcogen other than oxygen, and wherein the second TMD material has a composition $MX_nO_{1-n}$, where M is the second transition metal, X is a chalcogen atom and, O is oxygen and wherein $0<n<1$.

In third examples, for any of the first through second examples, the first transition metal and the second transition metal are the same, and where the first TMD material and the second TMD material have a same crystal orientation.

In fourth examples, for any of the first through third examples, the second TMD material further includes a chalcogen other than oxygen, and where the second TMD material has a composition $MX_nO_{1-n}$, where M is the second transition metal, X is a chalcogen atom and, O is oxygen and where $0<n<1$.

In fifth examples, for any of the first through fourth examples, the first TMD material includes a first chalcogen and the second TMD material includes a second chalcogen, where the first chalcogen and the second chalcogen are the same.

In sixth examples, for any of the first through fifth examples, the channel layer has a thickness less than 1.4 nm.

In seventh examples, for any of the first through sixth examples, the channel layer further includes one or more layers between the first layer and the second layer, wherein each of the one or more layers comprises the first monocrystalline transition metal dichalcogenide (TMD) material, wherein each of the one or more layers is stoichiometric In eighth examples, for any of the first through seventh examples, the number of layers in the one or more layers is between 1 and 8, and wherein the channel layer has a thickness between 0.7 nm-7.0 nm In ninth examples, for any of the first through eighth examples, the first TMD material and the second TMD material includes at least one of molybdenum, tungsten or chromium, and at least one of sulfur, selenium or tellurium.

In tenth examples, a transistor structure includes a first channel layer over a second channel layer. The first and the second channel layers include a first layer including a first monocrystalline transition metal dichalcogenide (TMD) material, where the first layer is stoichiometric and includes a first transition metal. The first and the second channel layers further include a second layer above the first layer, the second layer including a second monocrystalline TMD material, where the second monocrystalline TMD material includes a second transition metal and oxygen, and where the second layer is sub-stoichiometric. The first and the second channel layers further include a third layer below the first layer, the third layer including the second monocrystalline TMD material, where the second monocrystalline TMD material includes the second transition metal and oxygen, and where the third layer is sub-stoichiometric. The transistor structure further includes a source material coupled to a first end of the first and second channel layers, a drain material coupled to a second end of the first and second channel layers, a gate electrode between the source material and the drain material, and between the first channel layer and the second channel layer and a gate dielectric between the gate electrode and each of the first channel layer and the second channel layer.

In eleventh examples, for any of the tenth example, the second TMD material further includes a chalcogen other than oxygen, and where the second TMD material has a composition $MX_nO_{1-n}$, where M is the second transition metal, X is a chalcogen atom and, O is oxygen and where $0<n<1$.

In twelfth examples, for any of the tenth through eleventh examples, the first transition metal and the second transition metal are the same, where the first TMD material and the second TMD material have a same crystal orientation, where the second TMD material further includes a chalcogen other than oxygen, and where the second TMD material has a composition $MX_nO_{1-n}$, where M is the second transition metal, X is a chalcogen atom and, O is oxygen and where $0<n<1$.

In thirteenth examples, for any of the tenth through twelfth examples, the first TMD material includes a first chalcogen, and the second TMD material includes a second chalcogen, where the first chalcogen and the second chalcogen are the same.

In a fourteenth example, for any of the tenth through thirteenth examples, each of the first channel layer and the second channel layer have a thickness less than 1 nm.

In fifteenth examples, for any of the tenth through fourteenth examples, the second layer has a first crystal orientation and the second layer has a second crystal orientation, where the first crystal orientation is opposite to the second crystal orientation.

In sixteenth examples, for any of the tenth through fifteenth examples, each of the first and second channel layers further includes one or more layers between the first layer and the second layer, wherein each of the one or more layers include the first monocrystalline transition metal dichalcogenide (TMD) material, wherein each of the one or more layers is stoichiometric. wherein the number of layers in the one or more layers is between 1 and 8, and wherein the first channel layer or the second channel layer has a thickness between 1.4 nm and 7.0 nm In seventeenth examples, for any of the tenth through sixteenth examples, the first and second channel layers each have a first thickness along a first direction orthogonal to a longitudinal length, where the first and second channel layers each have a second thickness along a second direction orthogonal to the first direction and to the longitudinal length, where the first thickness is between 2 nm and 10 nm, and where the second thickness is at least 0.7 nm.

In eighteenth examples, for any of the tenth through seventeenth examples, the gate electrode is directly adjacent to the gate dielectric on a top surface and a bottom surface of the first channel layer and directly adjacent to the gate dielectric on a top surface and on a bottom surface of the second channel layer.

In nineteenth examples, a method of fabricating a transistor includes forming a material layer stack including a layer of a III-N material on a plurality of bilayers, where each bilayer is formed by depositing a channel layer including a transition metal dichalcogenide (TMD) material on a layer of the III-N material. The method further includes patterning a material layer stack into a block, forming a dummy gate over a first portion of the block, forming a dielectric adjacent the dummy gate and adjacent to the block, where the dielectric includes a first portion adjacent to one sidewall of the dummy gate and a second portion adjacent to a second sidewall of the dummy gate, the second sidewall opposite to the first sidewall. The method further includes etching and removing the dummy gate, etching and removing the layer of III-N material adjacent to the channel layer in the plurality of bilayers between the first portion and the second portion of the dielectric to form a plurality of channel layers. The method further includes breaking bonds between a transition metal and a chalcogen on outermost surfaces of the TMD material in the plurality of channel layers, forming a gate dielectric on outermost surfaces of each of the plurality of channel layer and forming a gate electrode on the gate dielectric layer. The method further includes forming a first opening over one end of the block and a second opening on a second end of the block where the first opening and the second opening are separated by the gate electrode and forming a first contact in the first opening and a second contact in the second opening.

In twentieth example, for any of the nineteenth examples, breaking the bonds between the transition metal and a chalcogen in the outermost surfaces of the TMD material in the plurality of channel layers creates sub stoichiometric outermost surfaces, where the method further includes partially oxidizing the sub stoichiometric outermost surfaces to create partially oxidized sub stoichiometric outermost surfaces and where forming the gate dielectric further includes forming a bond between oxygen in the gate dielectric and the partially oxidized sub stoichiometric outermost surfaces.

What is claimed is:

1. A transistor structure, comprising:
    a first channel layer over a second channel layer, wherein the first and the second channel layers comprise:
        a first layer comprising a first monocrystalline transition metal dichalcogenide (TMD) material, wherein the first layer is stoichiometric and comprises a first transition metal;
        a second layer above the first layer, the second layer comprising a second monocrystalline TMD material, wherein the second monocrystalline TMD material comprises a second transition metal and oxygen, and wherein the second layer is sub-stoichiometric; and
        a third layer below the first layer, the third layer comprising the second monocrystalline TMD material, wherein the second monocrystalline TMD material comprises the second transition metal and oxygen, wherein the third layer is sub-stoichiometric, and wherein the second layer has a first crystal orientation and the third layer has a second crystal orientation, where the first crystal orientation is opposite to the second crystal orientation;
    a source material coupled to a first end of the first and second channel layers;
    a drain material coupled to a second end of the first and second channel layers;
    a gate electrode between the source material and the drain material, and between the first channel layer and the second channel layer; and
    a gate dielectric between the gate electrode and each of the first channel layer and the second channel layer.

2. The transistor structure of claim 1, wherein the second monocrystalline TMD material further comprises a chalcogen different from oxygen, and wherein the second monocrystalline TMD material has a composition $MX_nO_{1-n}$, wherein M is the second transition metal, X is a chalcogen atom and, O is oxygen and wherein $0<n<1$.

3. The transistor structure of claim 1, further comprising one or more layers between the first layer and the second layer, wherein each of the one or more layers comprises the first monocrystalline TMD material, wherein each of the one or more layers is stoichiometric, wherein the number of layers in the one or more layers is between 1 and 8, and wherein the first channel layer or the second channel layer has a thickness between 1.4 nm and 7.0 nm.

4. The transistor structure of claim 1, wherein the first transition metal and the second transition metal are the same.

5. The transistor structure of claim 4, wherein the first monocrystalline TMD material comprises a first chalcogen, and the second monocrystalline TMD material comprises a second chalcogen, wherein the first chalcogen and the second chalcogen are the same.

6. The transistor structure of claim 5, wherein each of the first channel layer and the second channel layer have a thickness less than 1 nm.

7. The transistor structure of claim 1, wherein the first and second channel layers each have a first thickness along a first direction orthogonal to a longitudinal length, wherein the first and second channel layers each have a second thickness along a second direction orthogonal to the first direction and to the longitudinal length, wherein the first thickness is between 2 nm and 10 nm, and wherein the second thickness is at least 0.7 nm.

8. The transistor structure of claim 1, wherein the gate electrode is directly adjacent to the gate dielectric on a top surface and a bottom surface of the first channel layer and directly adjacent to the gate dielectric on a top surface and on a bottom surface of the second channel layer.

9. A transistor structure, comprising:
    a channel layer comprising:
        a first layer comprising a first monocrystalline transition metal dichalcogenide (TMD) material, wherein the first layer is stoichiometric and comprises a first transition metal;
        a second layer above the first layer, the second layer comprising a second monocrystalline TMD material, wherein the second monocrystalline TMD material comprises a second transition metal and oxygen, and wherein the second layer is sub-stoichiometric; and
        a third layer below the first layer, the third layer comprising the second monocrystalline
            TMD material, wherein the second monocrystalline TMD material comprises the second transition metal and oxygen, wherein the third layer is sub-stoichiometric, and wherein the second layer has a first crystal orientation and the third layer has a second crystal orientation, where the first crystal orientation is opposite to the second crystal orientation;
- a source and a drain coupled to the channel layer;
- a gate electrode between the source and the drain; and
- a gate dielectric between the gate electrode and the channel layer.

10. The transistor structure of claim 9, wherein the second monocrystalline TMD material further comprises a chalcogen different from oxygen, and wherein the second monocrystalline TMD material has a composition $MX_nO_{1-n}$, wherein M is the second transition metal, X is a chalcogen atom and, O is oxygen and wherein 0<n<1.

11. The transistor structure of claim 9, wherein the first transition metal and the second transition metal are the same.

12. The transistor structure of claim 11, wherein the first monocrystalline TMD material comprises a first chalcogen, and the second monocrystalline TMD material comprises a second chalcogen, wherein the first chalcogen and the second chalcogen are the same.

13. The transistor structure of claim 12, wherein the channel layer has a thickness less than 1 nm.

14. A transistor structure, comprising:
- a channel layer comprising:
  - a first transition metal dichalcogenide (TMD) material comprising a first layer of transition metal atoms between a first layer of chalcogen atoms and a second layer of chalcogen atoms;
  - a second TMD material above the first TMD material, the second TMD material comprising a second layer of transition metal atoms between a third layer of chalcogen atoms and a fourth layer of chalcogen atoms, wherein the fourth layer of chalcogen atoms comprises oxygen atoms and other chalcogen atoms, and wherein the third layer of chalcogen atoms is adjacent to the first TMD material; and
  - a third TMD material under the first TMD material, the third TMD material comprising a third layer of transition metal atoms between a fifth layer of chalcogen atoms and a sixth layer of chalcogen atoms, wherein the sixth layer of chalcogen atoms comprises oxygen atoms and other chalcogen atoms, and wherein the fifth layer of chalcogen atoms is adjacent to the first TMD material;
- a source and a drain coupled to the channel layer;
- a gate electrode between the source and the drain; and
- a gate dielectric between the gate electrode and the channel layer.

15. The transistor structure of claim 14, wherein the other chalcogen atoms of the fourth and sixth layers of chalcogen atoms comprise the same chalcogen atoms.

16. The transistor structure of claim 9, further comprising one or more layers between the first layer and the second layer, wherein each of the one or more layers comprises the first monocrystalline TMD material, wherein each of the one or more layers is stoichiometric, and wherein the number of layers in the one or more layers is between 1 and 8.

17. The transistor structure of claim 14, wherein the first, second, and third layers of transition metal atoms comprise the same transition metal atoms.

18. The transistor structure of claim 14, wherein the third and fifth layers of chalcogen atoms comprise the same chalcogen atoms.

19. The transistor structure of claim 14, further comprising one or more layers between the first TMD material and the second TMD material, wherein each of the one or more layers comprises the first TMD material, and wherein the number of layers in the one or more layers is between 1 and 8.

20. The transistor structure of claim 14, wherein the channel layer has a thickness less than 1 nm.

* * * * *